US012796083B2

(12) United States Patent
Lee et al.

(10) Patent No.: US 12,796,083 B2
(45) Date of Patent: Nov. 10, 2026

(54) DRIVING CIRCUIT IN NON-ACTIVE AREA FOR DRIVING DISPLAY PANEL

(71) Applicant: LG Display Co., Ltd., Seoul (KR)

(72) Inventors: Hyunsuk Lee, Seoul (KR); MyungHo Ban, Seoul (KR)

(73) Assignee: LG Display Co., Ltd. (KR)

(*) Notice: Subject to any disclaimer, the term of this patent is extended or adjusted under 35 U.S.C. 154(b) by 367 days.

(21) Appl. No.: 18/541,494

(22) Filed: Dec. 15, 2023

(65) Prior Publication Data

US 2024/0258491 A1 Aug. 1, 2024

(30) Foreign Application Priority Data

Jan. 31, 2023 (KR) ........................ 10-2023-0013300

(51) Int. Cl.
*H10D 86/40* (2025.01)
*H10D 86/60* (2025.01)

(52) U.S. Cl.
CPC ........... *H10D 86/441* (2025.01); *H10D 86/60* (2025.01)

(58) Field of Classification Search
CPC ..... H10D 86/60; H10D 86/441; H10K 59/131
See application file for complete search history.

(56) References Cited

U.S. PATENT DOCUMENTS

| | | | | |
|---|---|---|---|---|
| 2019/0096974 | A1 | 3/2019 | Kim | |
| 2020/0411630 | A1* | 12/2020 | Kim | H10K 59/1315 |
| 2021/0013293 | A1 | 1/2021 | Hao et al. | |
| 2022/0181399 | A1 | 6/2022 | Shim | |

FOREIGN PATENT DOCUMENTS

| | | | |
|---|---|---|---|
| KR | 10-2019-0036617 | A | 4/2019 |
| KR | 10-2021-0002287 | A | 1/2021 |
| KR | 10-2022-0071105 | A | 5/2022 |
| KR | 10-2022-0080492 | A | 6/2022 |

* cited by examiner

*Primary Examiner* — Changhyun Yi
(74) *Attorney, Agent, or Firm* — Fish & Richardson P.C.

(57) ABSTRACT

A display device capable of preventing a pol-melting phenomenon of a display panel, by reducing heat generation of the display panel by lowering current density, through including a triple wiring structure including a low-resistance metal in a link portion where a plurality of signal wirings are integrated.

18 Claims, 28 Drawing Sheets

DRIVING CIRCUIT IN NON-ACTIVE AREA FOR DRIVING DISPLAY PANEL

CROSS-REFERENCE TO RELATED APPLICATION

This application claims priority from Korean Patent Application No. 10-2023-0013300, filed on Jan. 31, 2023, which is hereby incorporated by reference in its entirety.

BACKGROUND

Field of the Disclosure

Aspects of the present disclosure relate to a display device.

Description of the Background

Display devices are being widely used as display screens of a notebook computer, a tablet computer, a smartphone, a portable display device and a portable information device, in addition to the display device of a televisions or a monitor.

Display devices may be classified into a reflective display device and a light emitting display device. The reflective display device is a type of display device in which natural light or light emitted from an external lighting of the display device is reflected on the display device to display information, and the light emitting display device is a type of display device in which a light emitting element or light source is built in the display device and information is displayed using light generated from the built-in light emitting element or light source.

In the case of a conventional display device, a bottleneck portion through which a driving voltage or a common voltage is applied has a problem in that a pol-melting phenomenon occurs due to heat generation of a display panel by an increase in current density as a plurality of signal wirings are integrated in a limited space.

SUMMARY

Accordingly, the present disclosure is directed to a display device that substantially obviates one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a display device capable of preventing a pol-melting phenomenon of a display panel, by reducing heat generation of the display panel by lowering current density, through including a triple wiring structure including a low-resistance metal in a link portion where a plurality of signal wirings are integrated.

Various aspects of the present disclosure are directed to providing a display device which is capable of being driven with high luminance, by reducing heat generation of a display panel by lowering current density.

Various aspects of the present disclosure are directed to providing a display device which is capable of low power consumption, by reducing heat generation of a panel by lowering current density.

Various aspects of the present disclosure are directed to providing a display device which is capable of a narrow bezel, by reducing an area where wirings are disposed.

To achieve these and other advantages and in accordance with the present disclosure, as embodied and broadly described, a display device includes a substrate including an active area and a non-active area which surrounds the active area; a plurality of circuit films positioned at a first side of the substrate, and positioned in the non-active area to be spaced apart from each other; and a first link portion connected to a connection wiring of the circuit film in the non-active area, the first link portion including: a first metal layer disposed on the substrate; a buffer layer covering an upper surface of the substrate and the first metal layer; a gate insulating film disposed on the buffer layer; a first signal wiring disposed on the gate insulating film; a planarization layer covering an upper surface of the buffer layer and the first signal wiring; a first link wiring disposed on the planarization layer; and a low-temperature passivation layer covering an upper surface of the planarization layer and the first link wiring, wherein the first link wiring and the first signal wiring and the first signal wiring and the first metal layer are electrically connected through contact holes, respectively.

Various aspects of the present disclosure may provide a display device in which the first link wiring includes a transparent conductive oxide layer and an auxiliary metal layer disposed on the transparent conductive oxide layer.

According to the aspects of the present disclosure, it is possible to provide a display device capable of preventing a pol-melting phenomenon of a display panel, by reducing heat generation of the display panel by lowering current density, through including a triple wiring structure including a low-resistance metal in a link portion where a plurality of signal wirings are integrated.

According to the aspects of the present disclosure, it is possible to provide a display device which is capable of being driven with high luminance, by reducing heat generation of a display panel by lowering current density.

According to the aspects of the present disclosure, it is possible to provide a display device which is capable of low power consumption, by reducing heat generation of a panel by lowering current density.

According to the aspects of the present disclosure, it is possible to provide a display device which is capable of a narrow bezel, by reducing an area where wirings are disposed.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1:
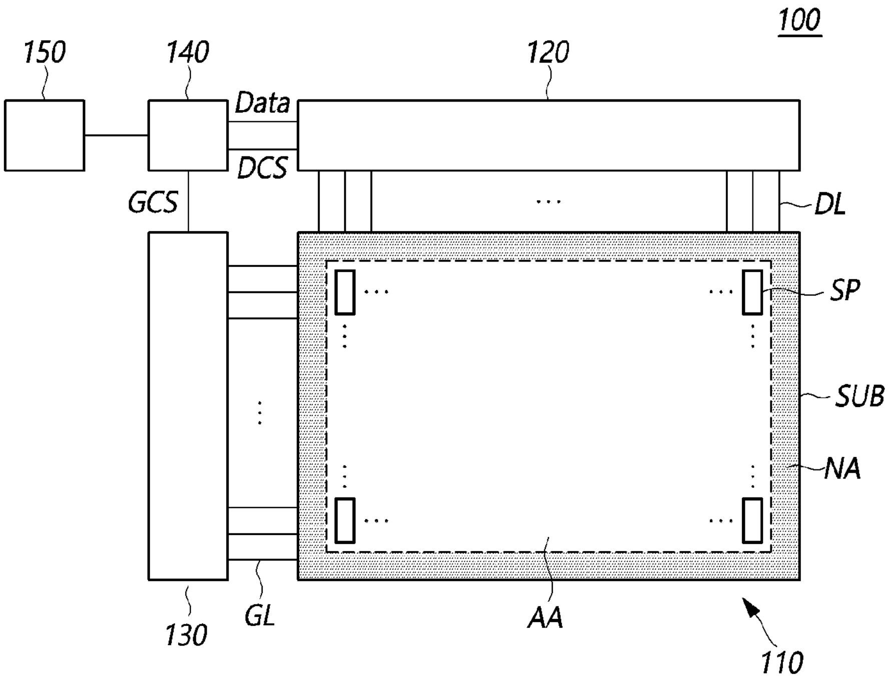
FIG. 1 is a system configuration diagram of a display device in accordance with aspects of the present disclosure.

In the following description of examples or aspects of the present disclosure, reference will be made to the accompanying drawings in which it is shown by way of illustration specific examples or aspects that may be implemented, and in which the same reference numerals and signs may be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only may the first element "be directly connected or coupled to" or "directly contact or overlap" the second element, but a third element may also be "interposed" between the first and second elements, or the first and second elements may "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e. g., level, range, etc.) include a tolerance or error range that may be caused by various factors (e. g., process factors, internal or external impact, noise, etc.) even when a relevant description is not specified. Further, the term "may" fully encompasses all the meanings of the term "may".

Hereinafter, various aspects of the present disclosure will be described in detail with reference to accompanying drawings.

FIG. 1 is a system configuration diagram of a display device 100 in accordance with aspects of the present disclosure.

Referring to FIG. 1, the display device 100 in accordance with the aspects of the present disclosure may include a display panel 110 and a driving circuit for driving the display panel 110.

The driving circuit may include a data driving circuit 120 and a gate driving circuit 130, and may further include a controller 140 which controls the data driving circuit 120 and the gate driving circuit 130.

The display panel 110 may include a substrate SUB and signal wirings such as a plurality of data lines DL and a plurality of gate lines GL disposed on the substrate SUB. The display panel 110 may include a plurality of subpixels SP which are connected to the plurality of data lines DL and the plurality of gate lines GL.

The display panel 110 may include an active area AA where an image is displayed and a non-active area NA where an image is not displayed. In the display panel 110, the plurality of subpixels SP for displaying an image may be disposed in the active area AA, and, in the non-active area NA, driving circuits 120, 130 and 140 may be electrically connected or mounted and pad parts to which integrated circuits or printed circuits are connected may be disposed.

The data driving circuit 120 as a circuit for driving the plurality of data lines DL may supply data signals to the plurality of data lines DL. The gate driving circuit 130 as a circuit for driving the plurality of gate lines GL may supply gate signals to the plurality of gate lines GL. To control the operation timing of the data driving circuit 120, the controller 140 may supply a data control signal DCS to the data driving circuit 120. The controller 140 may supply a gate control signal GCS for controlling the operation timing of the gate driving circuit 130 to the gate driving circuit 130.

The controller 140 may start a scan according to a timing implemented in each frame, may convert input image data inputted from the outside to be suitable for a data signal format used in the data driving circuit 120 and supply converted image data Data to the data driving circuit 120, and may control driving of data at a proper time corresponding to the scan.

To control the gate driving circuit 130, the controller 140 may output various gate control signals GCS including a gate start pulse (GSP), a gate shift clock (GSC), a gate output enable signal (GOE) and so on.

To control the data driver circuit 120, the controller 140 may output various data control signals DCS including a source start pulse (SSP), a source sampling clock (SSC), a source output enable signal (SOE) and so on.

The controller 140 may be implemented as a component separate from the data driving circuit 120, or may be implemented as an integrated circuit by being incorporated with the data driving circuit 120.

The data driving circuit 120 receives the image data Data from the controller 140, and supplies data voltages to the plurality of data lines DL, thereby driving the plurality of data lines DL. The data driving circuit 120 is also referred to as a source driving circuit.

Such a data driving circuit 120 may include at least one source driver integrated circuit (SDIC).

For example, each source driver integrated circuit (SDIC) may be connected to the display panel 110 in a tape automated bonding (TAB) method, may be connected to bonding pads of the display panel 110 in a chip-on-glass (COG) or chip-on-panel (COP) method, or may be connected to the display panel 110 by being implemented in a chip-on-film (COF) method.

The gate driving circuit 130 may output a gate signal of a turn-on level voltage or a gate signal of a turn-off level voltage under the control of the controller 140. By sequentially supplying gate signals of a turn-on level voltage to the plurality of gate lines GL, the gate driving circuit 130 may sequentially drive the plurality of gate lines GL.

The gate driving circuit 130 may be connected to the display panel 110 in a tape automated bonding (TAB) method, may be connected to bonding pads of the display panel 110 in a chip-on-glass (COG) or chip-on-panel (COP) method, or may be connected to the display panel 110 according to a chip-on-film (COF) method. Alternatively, the gate driving circuit 130 may be formed in the non-active area NA of the display panel 110 in a gate-in-panel (GIP) type. The gate driving circuit 130 may be disposed on the substrate SUB or may be connected to the substrate SUB. That is to say, in the case of the GIP type, the gate driving circuit 130 may be disposed in the non-active area NA of the substrate SUB. In the case of the chip-on-glass (COG) type or the chip-on-film (COF) type, the gate driving circuit 130 may be connected to the substrate SUB.

At least one driving circuit of the data driving circuit 120 and the gate driving circuit 130 may be disposed in the active area AA. For example, at least one driving circuit of the data driving circuit 120 and the gate driving circuit 130 may be disposed not to overlap with the subpixels SP, or may be disposed to partially or entirely overlap with the subpixels SP.

When a specific gate line GL is opened by the gate driving circuit 130, the data driving circuit 120 may convert image data Data received from the controller 140 into data voltages of an analog form, and may supply the data voltages to the plurality of data lines DL.

The data driving circuit 120 may be connected to one side (e.g., the top side or the bottom side) of the display panel 110. Depending on a driving method, a panel design method, etc., the data driving circuit 120 may be connected to both sides (e.g., the top side and the bottom side) of the display panel 110, or may be connected to at least two sides of the four sides of the display panel 110.

The gate driving circuit 130 may be connected to one side (e.g., the left side or the right side) of the display panel 110. Depending on a driving method, a panel design method, etc., the gate driving circuit 130 may be connected to both sides (e.g., the left side and the right side) of the display panel 110, or may be connected to at least two sides of the four sides of the display panel 110.

The controller 140 may be a timing controller which is used in a typical display technology, may be a control device which includes a timing controller and is capable of further performing other control functions, may be a control device which is different from a timing controller, or may be a circuit in a control device. The controller 140 may be implemented by various circuits or electronic parts such as an integrated circuit (IC), a field programmable gate array (FPGA), an application specific integrated circuit (ASIC) or a processor.

The controller 140 may be mounted on a printed circuit board, a flexible printed circuit board or the like, and may be electrically connected to the data driving circuit 120 and the gate driving circuit 130 through the printed circuit board, the flexible printed circuit board or the like.

The display device 100 in accordance with the aspects of the present disclosure may be a display including a back light unit or a self-luminous display such as an organic light emitting diode (OLED) display, a quantum dot display or a micro light emitting diode (micro LED) display, of a liquid crystal display device or the like.

When the display device 100 in accordance with the aspects of the present disclosure is an OLED display, each subpixel SP may include, as a light emitting element, an organic light emitting diode (OLED) which emits light by itself. When the display device 100 in accordance with the aspects of the present disclosure is a quantum dot display, each subpixel SP may include a light emitting element made of a quantum dot being a semiconductor crystal which emits light by itself. When the display device 100 in accordance with the aspects of the present disclosure is a micro LED display, each subpixel SP may include, as a light emitting element, a micro light emitting diode (micro LED) which emits light by itself and is made on the basis of an inorganic material.

Figure 2:
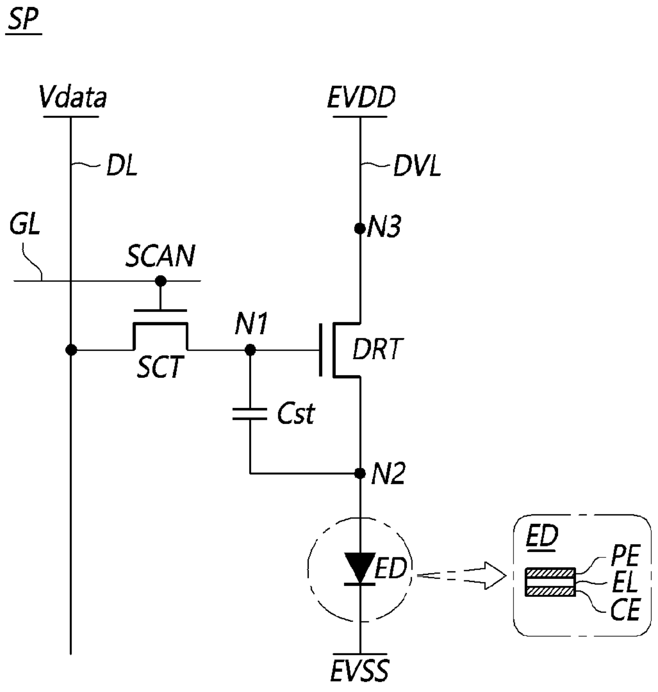
FIG. 2 is an equivalent circuit diagram of a subpixel of the display device in accordance with the aspects of the present disclosure.
Figure 3:
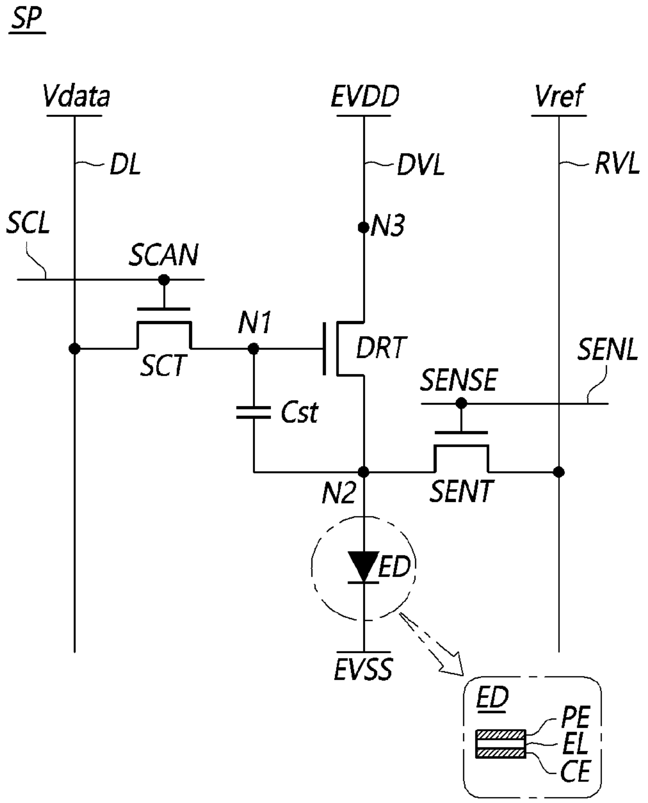
FIG. 3 is another equivalent circuit diagram of a subpixel of the display device in accordance with the aspects of the present disclosure.

FIG. 2 is an equivalent circuit diagram of a subpixel SP of the display device 100 in accordance with the aspects of the present disclosure, and FIG. 3 is another equivalent circuit diagram of a subpixel SP of the display device 100 in accordance with the aspects of the present disclosure. In the following description, the same or similar content to that described above with reference to FIG. 1 will be omitted or simply described.

Referring to FIG. 2, each of the plurality of subpixels SP disposed in the display panel 110 of the display device 100 in accordance with the aspects of the present disclosure may include a light emitting element ED, a driving transistor DRT, a scan transistor SCT and a storage capacitor Cst.

Referring to FIG. 2, the light emitting element ED may include a pixel electrode PE and a common electrode CE, and may include a light emitting layer EL which is positioned between the pixel electrode PE and the common electrode CE.

The pixel electrode PE of the light emitting element ED may be an electrode which is disposed in each subpixel SP, and the common electrode CE may be an electrode which is disposed in common in all the subpixels SP. The pixel electrode PE may be an anode electrode, and the common electrode CE may be a cathode electrode. Conversely, the pixel electrode PE may be a cathode electrode, and the common electrode CE may be an anode electrode.

For example, the light emitting element ED may be an organic light emitting diode (OLED), a light emitting diode (LED) or a quantum dot light emitting element.

The driving transistor DRT as a transistor for driving the light emitting element ED may include a first node N1, a second node N2 and a third node N3.

The first node N1 of the driving transistor DRT may be a gate node of the driving transistor DRT, and may be electrically connected to a source node or a drain node of the scan transistor SCT. The second node N2 of the driving transistor DRT may be a source node or a drain node of the driving transistor DRT, and may be electrically connected to the pixel electrode PE of the light emitting element ED. The third node N3 of the driving transistor DRT may be electrically connected to a driving voltage line DVL which supplies a driving voltage EVDD.

The scan transistor SCT may be controlled by a scan signal SCAN as a kind of gate signal, and may be connected between the first node N1 of the driving transistor DRT and a data line DL. In other words, the scan transistor SCT may be turned on or off according to the scan signal SCAN supplied from a scan signal line SCL which is a kind of gate line GL, thereby controlling connection between the data line DL and the first nodes N1 of the driving transistor DRT.

The scan transistor SCT may be turned on by the scan signal SCAN having a turn-on level voltage, and thereby, may transfer a data voltage Vdata supplied from the data line DL to the first node N1 of the driving transistor DRT.

When the scan transistor SCT is an n-type transistor, the turn-on level voltage of the scan signal SCAN may be a high level voltage. When the scan transistor SCT is a p-type transistor, the turn-on level voltage of the scan signal SCAN may be a low level voltage.

The storage capacitor Cst may be connected between the first node N1 and the second node N2 of the driving transistor DRT. The storage capacitor Cst is charged with an amount of charge corresponding to a voltage difference between both ends, and serves to maintain the voltage difference between both the ends during a predetermined frame time. Accordingly, during the predetermined frame time, the corresponding subpixel SP may emit light.

Referring to FIG. 3, each of the plurality of subpixels SP disposed in the display panel 110 of the display device 100 in accordance with the aspects of the present disclosure may further include a sensing transistor SENT.

The sensing transistor SENT may be controlled by a sense signal SENSE as a kind of gate signal, and may be connected between the second node N2 of the driving transistor DRT and a reference voltage line RVL. In other words, the sensing transistor SENT may be turned on or off according to the sense signal SENSE supplied from a sense signal line SENL which is another kind of gate line GL, thereby controlling connection between the reference voltage line RVL and the second node N2 of the driving transistor DRT.

The sensing transistor SENT may be turned on by the sense signal SENSE having a turn-on level voltage, and thereby, may transfer a reference voltage Vref supplied from the reference voltage line RVL to the second node N2 of the driving transistor DRT.

The sensing transistor SENT may be turned on by the sense signal SENSE having a turn-on level voltage, and thereby, may transfer a voltage of the second node N2 of the driving transistor DRT to the reference voltage line RVL.

When the sensing transistor SENT is an n-type transistor, the turn-on level voltage of the sense signal SENSE may be a high level voltage. When the sensing transistor SENT is a p-type transistor, the turn-on level voltage of the sense signal SENSE may be a low level voltage.

The function of the sensing transistor SENT to transfer the voltage of the second node N2 of the driving transistor DRT to the reference voltage line RVL may be used during a driving to sense the characteristic value of the subpixel SP. In this case, a voltage transferred to the reference voltage line RVL may be a voltage for calculating the characteristic value of the subpixel SP or a voltage on which the characteristic value of the subpixel SP is reflected.

Each of the driving transistor DRT, the scan transistor SCT and the sensing transistor SENT may be an n-type transistor or a p-type transistor. In the present disclosure, for the sake of convenience in explanation, it is exemplified that each of the driving transistor DRT, the scan transistor SCT and the sensing transistor SENT is an n-type.

The storage capacitor Cst may not be a parasitic capacitor (e.g., Cgs or Cgd) which is an internal capacitor existing between the gate node and the source node (or the drain node) of the driving transistor DRT, but may be an external capacitor which is intentionally designed outside the driving transistor DRT.

The scan signal line SCL and the sense signal line SENL may be different gate lines GL. In this case, the scan signal SCAN and the sense signal SENSE may be separate gate signals, and an on-off timing of the scan transistor SCT and an on-off timing of the sensing transistor SENT in one subpixel SP may be independent of each other. In other words, an on-off timing of the scan transistor SCT and an on-off timing of the sensing transistor SENT in one subpixel SP may be the same as or different from each other.

Unlike this, the scan signal line SCL and the sense signal line SENL may be the same gate line GL. Namely, the gate node of the scan transistor SCT and the gate node of the sensing transistor SENT in one subpixel SP may be connected to one gate line GL. In this case, the scan signal SCAN and the sense signal SENSE may be the same gate signal, and an on-off timing of the scan transistor SCT and an on-off timing of the sensing transistor SENT in one subpixel SP may be the same as each other.

The structures of the subpixels SP illustrated in FIGS. 2 and 3 are only examples, and may each be variously modified by further including at least one transistor or at least one capacitor. Each of the plurality of subpixels SP may have the same structure, and some of the plurality of subpixels SP may have a different structure. Each of the driving transistor DRT and the scan transistor SCT may be an n-type transistor or a p-type transistor.

Figure 4:
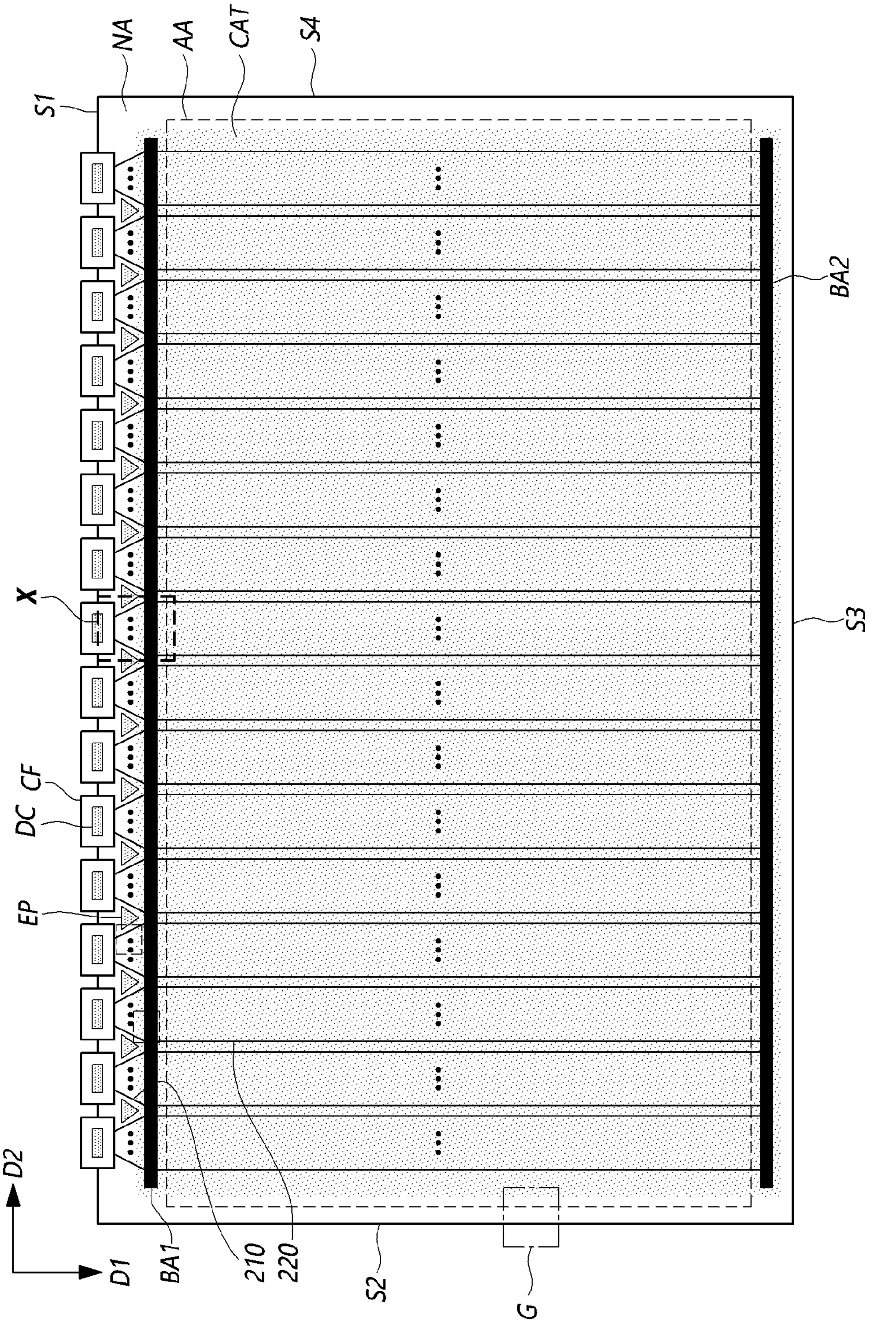
FIG. 4 is a plan view of the display device in accordance with the aspects of the present disclosure.
Figure 5:
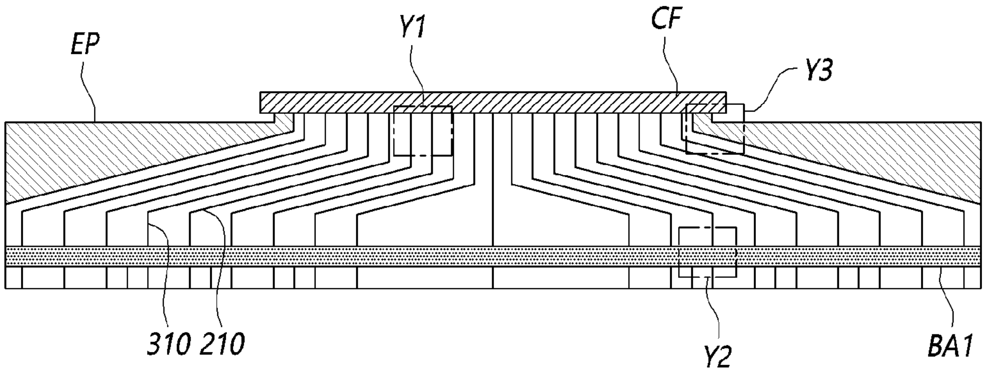
FIG. 5 is an enlarged view of an area X of FIG. 4.

FIG. 4 is a plan view of the display device in accordance with the aspects of the present disclosure, and FIG. 5 is an enlarged view of an area X of FIG. 4. In the following description, the same or similar content to that described above with reference to FIGS. 1 to 3 will be omitted or simply described.

Referring to FIGS. 4 and 5, the substrate SUB may include the active area AA and the non-active area NA. The active area AA may refer to an area where a plurality of subpixels are arranged. The non-active area NA as an area which surrounds the active area AA may mean an area where subpixels are not arranged.

The substrate SUB may be a glass substrate or a plastic substrate. The substrate SUB may be a transistor substrate in which transistors are positioned on one surface.

A plurality of circuit films CF may be positioned at a first side S1 of the substrate SUB. The fact that the circuit films CF are positioned at the first side S1 of the substrate SUB may mean that one part of circuit films CF are positioned at the first side S1 being one side of the substrate SUB and the other part of the circuit films CF are positioned outside the first side S1 of the substrate SUB.

The substrate SUB may include a first side S1, a second side S2, a third side S3 and a fourth side S4. The first side S1 of the substrate SUB, for example, as a side at which the plurality of circuit films CF are positioned, may refer to a side at which the data driving circuit of the display panel is positioned. The third side S3 of the substrate SUB may be an opposite side which faces the first side S1. The second side S2 and the fourth side S4, as remaining sides other than the first side S1 and the third side S3, may refer to, for example, sides where the gate driving circuit of the display panel is positioned.

A driving chip DC may be mounted on the circuit film CF. The driving chip DC may be positioned on the circuit film CF, for example, in a chip-on-film (COF) method.

A plurality of circuit films CF may be positioned in the non-active area NA to be spaced apart from each other.

A first signal wiring 220 may include a first link portion 210 which is connected to the circuit film CF. The first signal wiring 220 may extend in a first direction D1 toward the active area AA. In the present disclosure, the first direction D1 may be a column line direction or a row line direction in the display device, and a second direction D2 may be a direction perpendicular to the first direction D1. The first signal wiring 220 may be, for example, a driving voltage wiring to which the driving voltage EVDD is applied. The first link portion 210 as a portion of the first signal wiring 220 may be a portion of the first signal wiring 220 which is positioned in the non-active area NA.

A first bar BA1 may be positioned at the first side S1 of the substrate SUB. The fact that the first bar BA1 is positioned at the first side S1 of the substrate SUB may mean that, for example, when the substrate SUB has a quadrangular shape, the first bar BA1 is positioned closest to the first side S1 as one side of the four sides of a quadrangle.

The first bar BA1 may be positioned in the non-active area NA, and may be positioned to extend in the second direction D2 perpendicular to the first direction D1. Namely, the first bar BA1 may be disposed parallel to the first side S1 of the substrate SUB.

The first bar BA1 may be positioned closer to the active area AA than the first link portion 210. That is to say, from the first side S1 of the substrate SUB, the circuit film CF, the first link portion 210 and the first bar BA1 may be disposed in this order.

The first bar BA1 may be electrically connected to the plurality of first signal wirings 220. As the first bar BA1 is electrically connected to the plurality of first signal wirings 220, when a voltage is applied to the first signal wiring 220 including the first link portion 210, the voltage may be simultaneously applied to a first signal wiring 220 which does not include a first link portion 210.

A second bar BA2 may be positioned in the non-active area NA, and may be positioned to extend in the second direction D2 perpendicular to the first direction D1. The second bar BA2 may be positioned at the third side S3 as a side opposite to the first side S1 of the substrate SUB at which the first bar BA1 is positioned.

The second bar BA2 may be electrically connected to the plurality of first signal wirings 220. As the second bar BA2 is electrically connected to the plurality of first signal wirings 220, a driving voltage may be effectively applied to the plurality of first signal wirings 220.

To ensure that the display device has high luminance, a method of applying a high voltage to the first signal wiring 220 may be used. However, when a high voltage is applied to the first signal wiring 220, a bottleneck phenomenon may occur as current flows from the circuit film CF to the first link portion 210. At a portion of the circuit film CF, as current mainly flows in a direction perpendicular to the active area AA, a wide cross-sectional area of a wiring through which the current moves may be secured. However, at the first link portion 210, since current should move on a plane parallel to the active area AA to flow in the first direction D1, it is difficult to secure a wide cross-sectional area. Therefore, a lot of heat may be generated in an area where the first link portion 210 is positioned.

An electrode pattern EP may be positioned between the first link portions 210 of the first signal wirings 220. The electrode pattern EP may be positioned between two adjacent circuit films CF. That is to say, the electrode pattern EP may be positioned between first link portions 210 which are connected to two adjacent circuit films CF, respectively. The electrode pattern EP may be connected to two adjacent circuit films CF.

The electrode pattern EP may contact a common electrode. The electrode pattern EP may apply a common voltage. The common voltage applied to the electrode pattern EP may be a base voltage EVSS illustrated in FIG. 2.

A cathode electrode CAT being a common electrode may be positioned in the active area AA. The cathode electrode CAT may contact the electrode pattern EP.

Since the electrode pattern EP is positioned between first link portions 210 and needs to connect adjacent circuit films CF, a bottleneck phenomenon may occur at a portion where the electrode pattern EP is connected to the circuit film CF, due to a limitation in space. In more detail, as current flows in order of the cathode electrode CAT, the electrode pattern EP and the circuit film CF, a bottleneck phenomenon may occur at a portion where the electrode pattern EP and the circuit film CF are connected. Due to this bottleneck phenomenon, a portion where the electrode pattern EP is positioned may be a main portion where heat is generated in the display device.

Referring to FIGS. 4 and 5, the first signal wiring 220 may extend in the first direction D1 toward the active area AA. A data wiring may be positioned between first signal wirings 220. The data wiring may extend in the first direction D1 toward the active area AA. The data wiring may include a data wiring link portion 310 which is positioned in the non-active area NA. The data wiring link portion 310 as a portion of the data wiring may be a portion of the data wiring which is positioned in the non-active area NA.

A plurality of data wirings may be positioned between the plurality of first signal wirings 220. The first signal wirings 220 and the data wirings may be alternately positioned. At least two data wirings may be positioned between two adjacent first signal wirings 220.

Some of the first signal wirings 220 may not include first link portions 210, and may be electrically connected to the other first signal wirings 220 which include first link portions 210, by the first bar BA1.

Since the first signal wiring 220 is positioned between data wirings and the first link portion 210 of the first signal wiring 220 is positioned between the data wiring link portions 310 of the data wirings, the first link portion 210 of the first signal wiring 220 is positioned in a limited space.

Therefore, due to such structural characteristics, a problem may arise in that a large amount of heat is generated in the first link portion 210.

Figure 6A:
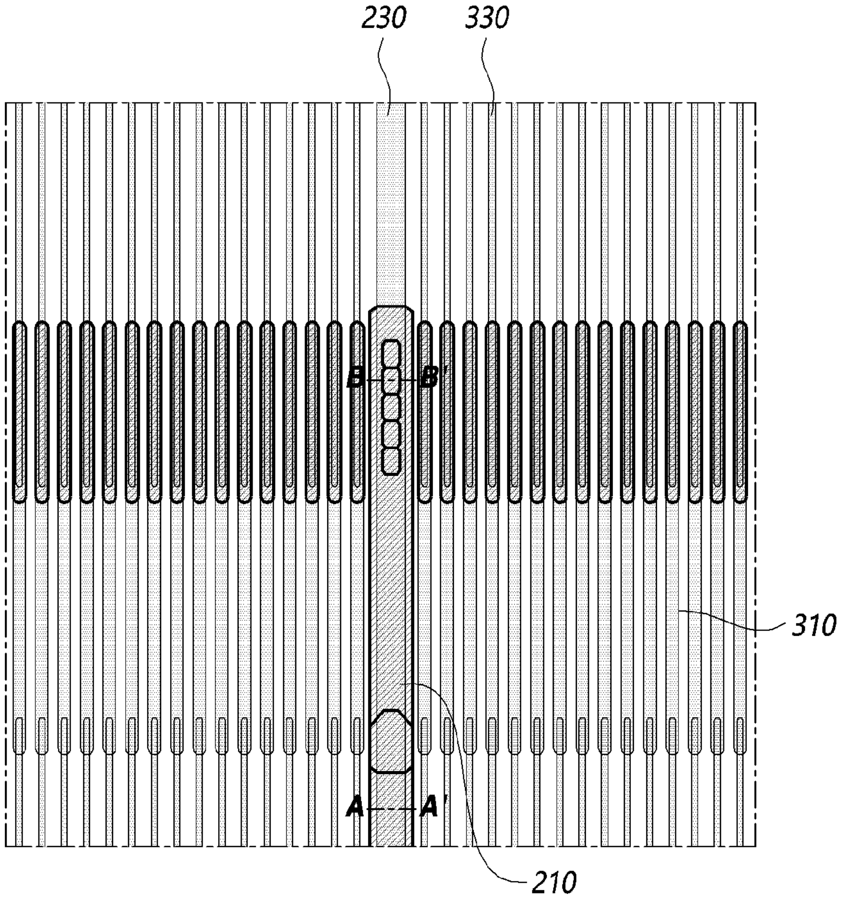
FIG. 6A is an enlarged view of an area Y1 of FIG. 5.
Figure 6B:
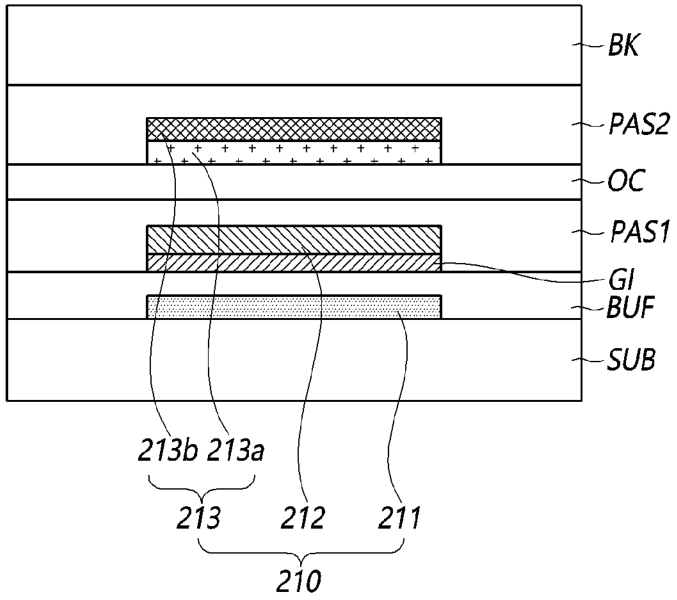
FIG. 6B is a cross-sectional view taken along the line A-A' of FIG. 6A.
Figure 6C:
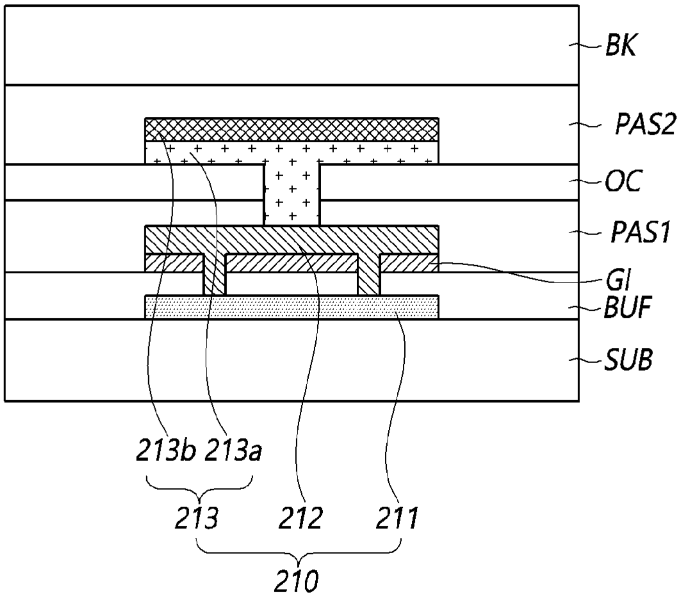
FIG. 6C is a cross-sectional view taken along the line B-B' of FIG. 6A.

FIG. 6A is an enlarged view of an area Y1 of FIG. 5, FIG. 6B is a cross-sectional view taken along the line A-A' of FIG. 6A, and FIG. 6C is a cross-sectional view taken along the line B-B' of FIG. 6A. In the following description, the same or similar content to that described above with reference to FIGS. 1 to 5 will be omitted or simply described.

FIG. 6A is a plan view illustrating the first link portion 210 disposed adjacent to the circuit film CF, FIG. 6B is a cross-sectional view illustrating the structure of triple wirings of the first link portion 210, and FIG. 6C is a cross-sectional view illustrating a structure in which the triple wirings of the first link portion 210 are electrically connected.

Referring to FIG. 6A, the first link portion 210 may be connected to a connection wiring 230 which extends from the circuit film CF. The connection wiring 230 may be a portion of the first signal wiring 220 which is disposed between the circuit film CF and the first link portion 210.

Referring to FIG. 6B, the first link portion 210 may include a first metal layer 211, a first signal wiring 212 and a first link wiring 213. The first link wiring 213 may include a first layer 213*a* and a second layer 213*b* which is disposed on the first layer 213*a*.

Referring to FIG. 6B, the first link portion 210 may include the substrate SUB, the first metal layer 211, a buffer layer BUF, a gate insulating film GI, the first signal wiring 212, a passivation layer PAS1, a planarization layer OC, the first link wiring 213, and a low-temperature passivation layer PAS2.

The substrate SUB may be a glass substrate or a plastic substrate. The substrate SUB may be a flexible substrate, a bendable substrate or a stretchable substrate.

The first metal layer 211 may be disposed on the substrate SUB.

The first metal layer 211 may be the same material layer as a light shield. The light shield as a layer for protecting a transistor included in the display device may be a layer which is positioned between the transistor and the substrate SUB.

The buffer layer BUF may be disposed on the substrate SUB and the first metal layer 211.

The buffer layer BUF may be formed in a shape which covers the upper surface of the substrate SUB and the first metal layer 211.

The buffer layer BUF may include an inorganic insulating material such as silicon oxide (SiOx), silicon nitride (SiNx) and silicon oxynitride (SiON), but the aspects of the present disclosure are not limited thereto.

Although FIG. 6B illustrates a structure in which the buffer layer BUF is a single layer, the aspects of the present disclosure are not limited thereto. For example, an aspect in which the buffer layer BUF has a multi-layered structure may be included.

The gate insulating film GI may be disposed on the buffer layer BUF.

The gate insulating film GI may be disposed in an area which overlaps with the first metal layer 211.

The gate insulating film GI may be formed of, for example, silicon oxide (SiOx).

The first signal wiring 212 may be disposed on the gate insulating film GI.

The first signal wiring 212 may be disposed in an area which overlaps with the first metal layer 211 and the gate insulating film GI.

The first signal wiring 212 may be a signal wiring which extends from the connection wiring 230.

The first signal wiring 212 may be a driving voltage wiring DVL to which the driving voltage EVDD is applied.

The passivation layer PAS1 may be disposed on the buffer layer BUF and the first signal wiring 212.

The passivation layer PAS1 may be formed in a shape which covers the upper surface of the buffer layer BUF and the first signal wiring 212.

The passivation layer PAS1 may be formed of an inorganic insulating material, for example, silicon oxide (SiOx), silicon nitride (SiNx), silicon oxynitride (SiON) or a multilayer thereof.

The planarization layer OC may be disposed on the passivation layer PAS1.

The planarization layer OC may be formed of an organic insulating material such as acryl resin, epoxy resin, phenolic resin, polyamide resin and polyimide resin.

The first link wiring 213 may be disposed on the planarization layer OC.

The first link wiring 213 may be disposed in an area which overlaps with the first metal layer 211, the gate insulating film GI and the first signal wiring 212.

The first link wiring 213 may include the first layer 213*a* and the second layer 213*b* which is disposed on the first layer 213*a*.

The first layer 213*a* may include a transparent conductive oxide layer.

The transparent conductive oxide layer may include a transparent conductive oxide (TCO) of one of indium tin oxide (ITO), indium zinc oxide (IZO), indium tin zinc oxide (ITZO), indium gallium zinc oxide (IGZO), zinc oxide and tin oxide.

The second layer 213*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

The low-temperature passivation layer PAS2 may be disposed on the planarization layer OC and the first link wiring 213. The low-temperature passivation layer PAS2 may be formed in a shape which covers the upper surface of the planarization layer OC and the first link wiring 213.

The low-temperature passivation layer PAS2 may be a passivation layer which is formed in a low-temperature process. The low-temperature passivation layer PAS2 may be formed of an inorganic insulating material, for example, silicon oxide (SiOx), silicon nitride (SiNx), silicon oxynitride (SiON) or a multilayer thereof.

As the low-temperature passivation layer PAS2 is formed in a shape which covers the first link wiring 213, the first link wiring 213 may be protected. As the low-temperature passivation layer PAS2 is formed in a shape which covers the first layer 213*a* and the second layer 213*b* being the first link wiring 213, the low-resistance auxiliary metal layer included in the second layer 213*b* may be protected.

A bank BK may be disposed on the low-temperature passivation layer PAS2.

The bank BK may be formed at the boundary between subpixel areas. The bank BK may be disposed to partition subpixel areas. An area where the bank BK is formed may be defined as a non-emission area because the area does not emit light, and an area where the bank BK is not formed may be defined as an emission area.

The bank BK may be formed of an organic material such as acryl resin, epoxy resin, phenolic resin, polyamide resin and polyimide resin.

Referring to FIG. 6C, the triple wirings which constitute the first link portion 210 may be electrically connected through contact holes.

The first link wiring 213 and the first signal wiring 212 may be electrically connected through a contact hole. For example, the first layer 213*a* of the first link wiring 213 may be electrically connected to the first signal wiring 212 through a contact hole which is formed in the planarization layer OC and the passivation layer PAS1.

The first signal wiring 212 and the first metal layer 211 may be electrically connected through a contact hole. For example, the first signal wiring 212 may be electrically connected to the first metal layer 211 through a contact hole which is formed in the buffer layer BUF and the gate insulating film GI.

In the display device in accordance with the aspects of the present disclosure, since the first link portion 210 includes a triple wiring structure including a low-resistance metal at an area where the first link portion 210 in which a plurality of signal wirings are integrated is positioned, it is possible to prevent a pol-melting phenomenon of the display panel, by reducing heat generation of the display panel by lowering current density.

Figure 7A:
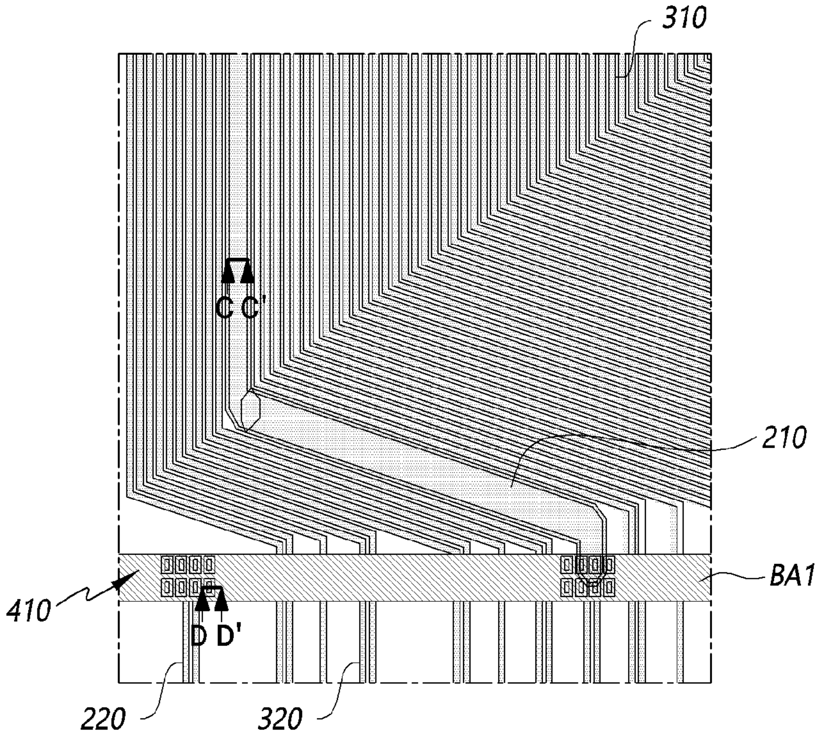
FIG. 7A is an enlarged view of area Y2 of FIG. 5.
Figure 7B:
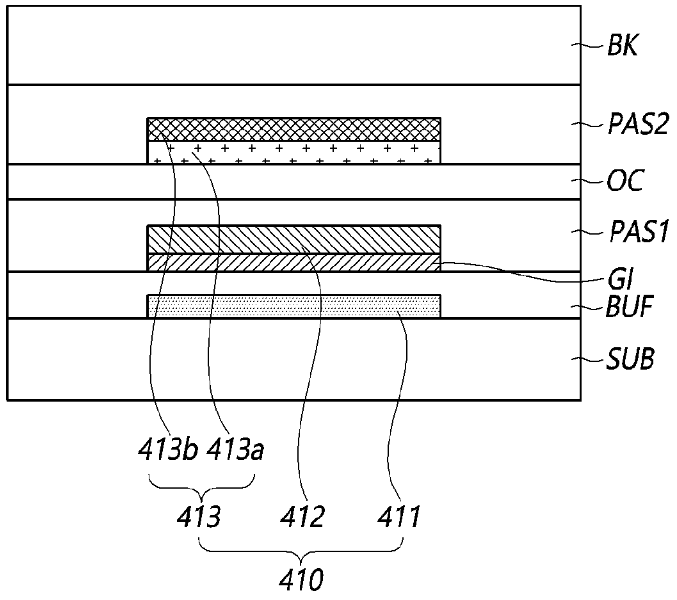
FIG. 7B is a cross-sectional view taken along line C-C' of FIG. 7A.
Figure 7C:
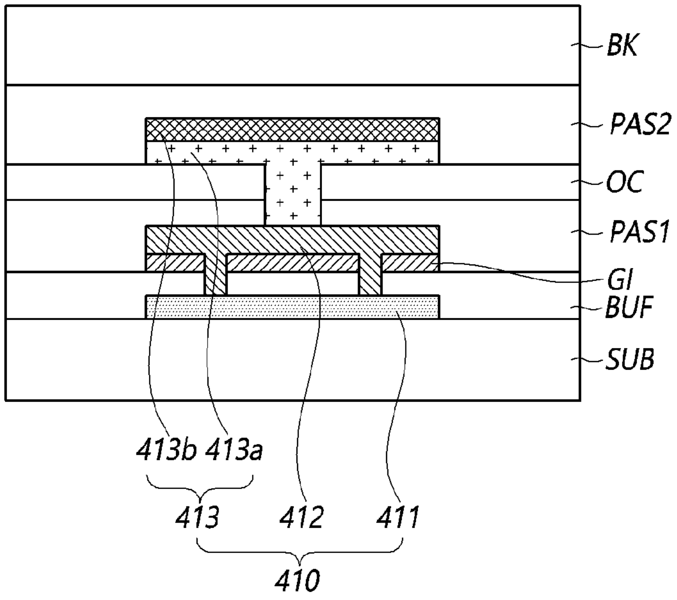
FIG. 7C is a cross-sectional view taken along line D-D' of FIG. 7A.

FIG. 7A is an enlarged view of an area Y2 of FIG. 5, FIG. 7B is a cross-sectional view taken along the line C-C' of FIG. 7A, and FIG. 7C is a cross-sectional view taken along the line D-D' of FIG. 7A. In the following description, the same or similar content to that described above with reference to FIGS. 1 to 6C will be omitted or simply described.

For example, FIG. 7A is a plan view illustrating a second link portion 410 which is disposed adjacent to the first bar BA1, FIG. 7B is a cross-sectional view illustrating the structure of triple wirings of the second link portion 410, and FIG. 7C is a cross-sectional view illustrating a structure in which the triple wirings of the second link portion 410 are electrically connected.

Referring to FIG. 7A, the second link portion 410 includes the first bar BA1 which is electrically connected to the first link portion 210. The first bar BA1 may be electrically connected to the plurality of first signal wirings 220. Some of the first signal wirings 220 may be electrically connected to the other first signal wirings 220 including second link portions 410 by the first bar BA1.

As the first bar BA1 is electrically connected to the plurality of first signal wirings 220, when a driving voltage is applied to the first signal wiring 220 including the second link portion 410, the driving voltage may be effectively applied simultaneously to the plurality of first signal wirings 220.

Since the configuration of the second link portion 410 disclosed in FIGS. 7B and 7C is substantially the same as the configuration of the first link portion 210 disclosed in FIG. 6B, the same or similar content will be omitted or simply described.

Referring to FIGS. 7B and 7C, the second link portion 410 may include a second metal layer 411, a second signal wiring 412 and a second link wiring 413. The second link wiring 413 may include a first layer 413*a* and a second layer 413*b* which is disposed on the first layer 413*a*.

Referring to FIGS. 7B and 7C, the second link portion 410 may include the substrate SUB, the second metal layer 411, the buffer layer BUF, the gate insulating film GI, the second signal wiring 412, the passivation layer PAS1, the planarization layer OC, the second link wiring 413, and the low-temperature passivation layer PAS2.

The second metal layer 411 may be the same material layer as a light shield. The light shield as a layer for protecting a transistor included in the display device may be a layer which is positioned between the transistor and the substrate SUB.

The second signal wiring 412 may be disposed in an area which overlaps with the second metal layer 411.

The second signal wiring 412 may be a driving voltage wiring DVL to which the driving voltage EVDD is applied.

The second link wiring 413 may include the first layer 413*a* and the second layer 413*b* which is disposed on the first layer 413*a*.

The first layer 413*a* may include a transparent conductive oxide layer.

The transparent conductive oxide layer may include one transparent conductive oxide (TCO) of indium tin oxide (ITO), indium zinc oxide (IZO), indium tin zinc oxide (ITZO), indium gallium zinc oxide (IGZO), and zinc oxide and tin oxide.

The second layer 413*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

The second link wiring 410 may be a portion of a portion which is integrally formed with the first bar BA1.

Referring to FIG. 7C, the triple wirings which constitute the second link portion 410 may be electrically connected through contact holes.

The second link wiring 413 and the second signal wiring 412 may be electrically connected through a contact hole. For example, the first layer 413*a* of the second link wiring 413 may be electrically connected to the second signal wiring 412 through a contact hole which is formed in the planarization layer OC and the passivation layer PAS1.

The second signal wiring 412 and the second metal layer 411 may be electrically connected through a contact hole. For example, the second signal wiring 412 may be electrically connected to the second metal layer 411 through a contact hole which is formed in the buffer layer BUF and the gate insulating film GI.

In the display device in accordance with the aspects of the present disclosure, since the second link portion 410 includes a triple wiring structure including a low-resistance metal at an area where the second link portion 410 in which a plurality of signal wirings are integrated is positioned, it is possible to prevent a pol-melting phenomenon of the display panel, by reducing heat generation of the display panel by lowering current density.

Figure 8A:
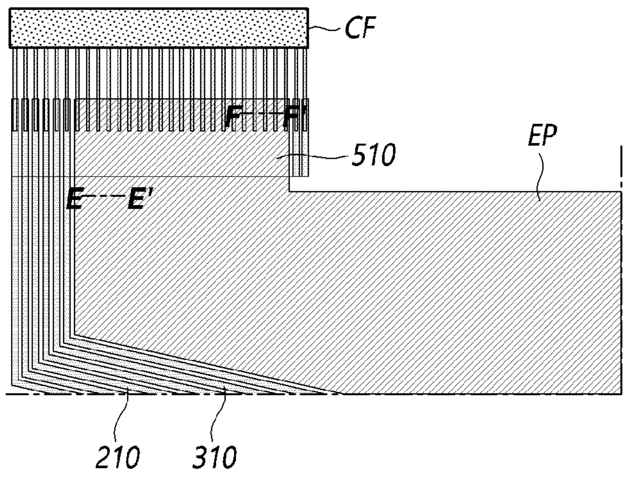
FIG. 8A is an enlarged view of area Y3 of FIG. 5.
Figure 8B:
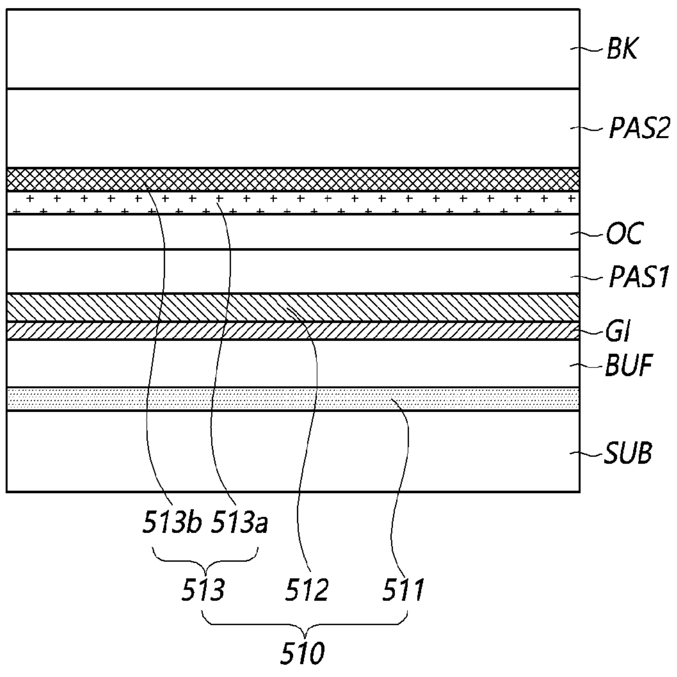
FIG. 8B is a cross-sectional view taken along line E-E' of FIG. 8A.
Figure 8C:
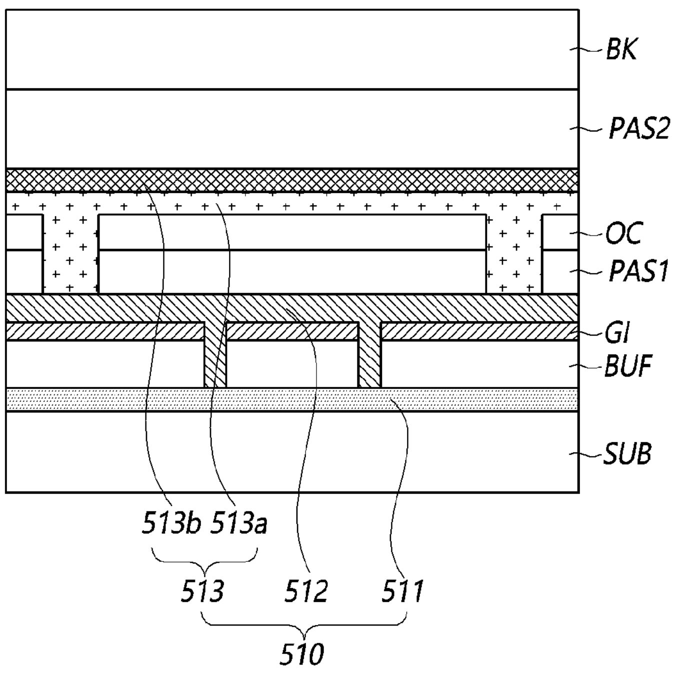
FIG. 8C is a cross-sectional view taken along line F-F' of FIG. 8A.

FIG. 8A is an enlarged view of an area Y3 of FIG. 5, FIG. 8B is a cross-sectional view taken along the line E-E' of FIG. 8A, and FIG. 8C is a cross-sectional view taken along the line F-F' of FIG. 8A. In the following description, the same or similar content to that described above with reference to FIGS. 1 to 7C will be omitted or simply described.

For example, FIG. 8A is a plan view illustrating a third link portion 510 which is disposed adjacent to the electrode pattern EP, FIG. 8B is a cross-sectional view illustrating the structure of triple wirings of the third link portion 510, and FIG. 8C is a cross-sectional view illustrating a structure in which the triple wirings of the third link portion 510 are electrically connected.

Referring to FIG. 8A, the third link portion 510 may be connected to the electrode pattern EP. The electrode pattern EP may include contact portions which are connected to the circuit film CF and a cathode electrode, respectively. As described above, when current flows to the cathode electrode, the electrode pattern EP and the circuit film CF, a bottleneck phenomenon may occur in the electrode pattern EP.

Since the configuration of the third link portion 510 disclosed in FIGS. 8B and 8C is substantially the same as the configuration of the first link portion 210 disclosed in FIG. 6B, the same or similar content will be omitted or simply described.

Referring to FIGS. 8B and 8C, the third link portion 510 may include a third metal layer 511, a third signal wiring 512 and a third link wiring 513. The third link wiring 513 may include a first layer 513*a* and a second layer 513*b* which is disposed on the first layer 513*a*.

Referring to FIGS. 8B and 8C, the third link portion 510 may include the substrate SUB, the third metal layer 511, the buffer layer BUF, the gate insulating film GI, the third signal wiring 512, the passivation layer PAS1, the planarization layer OC, the third link wiring 513, and the low-temperature passivation layer PAS2.

The third metal layer 511 may be the same material layer as a light shield. The light shield as a layer for protecting a transistor included in the display device may be a layer which is positioned between the transistor and the substrate SUB.

The third signal wiring 512 may be disposed in an area which overlaps with the third metal layer 511.

The third signal wiring 512 may be integrally formed with the electrode pattern EP.

The electrode pattern EP may apply a common voltage. The common voltage applied to the electrode pattern EP may be the base voltage EVSS illustrated in FIG. 2.

The third link wiring 513 may include the first layer 513*a* and the second layer 513*b* which is disposed on the first layer 513*a*.

The first layer 513*a* may include a transparent conductive oxide layer.

The transparent conductive oxide layer may include one transparent conductive oxide (TCO) of indium tin oxide (ITO), indium zinc oxide (IZO), indium tin zinc oxide (ITZO), indium gallium zinc oxide (IGZO), and zinc oxide and tin oxide.

The second layer 513*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

Referring to FIG. 8C, the triple wirings which constitute the third link portion 510 may be electrically connected through contact holes.

The third link wiring 513 and the third signal wiring 512 may be electrically connected through a contact hole. For example, the first layer 513*a* of the third link wiring 513 may be electrically connected to the third signal wiring 512 through a contact hole which is formed in the planarization layer OC and the passivation layer PAS1.

The third signal wiring 512 and the third metal layer 511 may be electrically connected through a contact hole. For example, the third signal wiring 512 may be electrically connected to the third metal layer 511 through a contact hole which is formed in the buffer layer BUF and the gate insulating film GI.

In the display device in accordance with the aspects of the present disclosure, since the third link portion 510 includes a triple wiring structure including a low-resistance metal at an area where the third link portion 510 which is connected to the electrode pattern EP is positioned, it is possible to prevent a pol-melting phenomenon of a display panel, by reducing heat generation of the display panel by lowering current density.

Figure 9A:
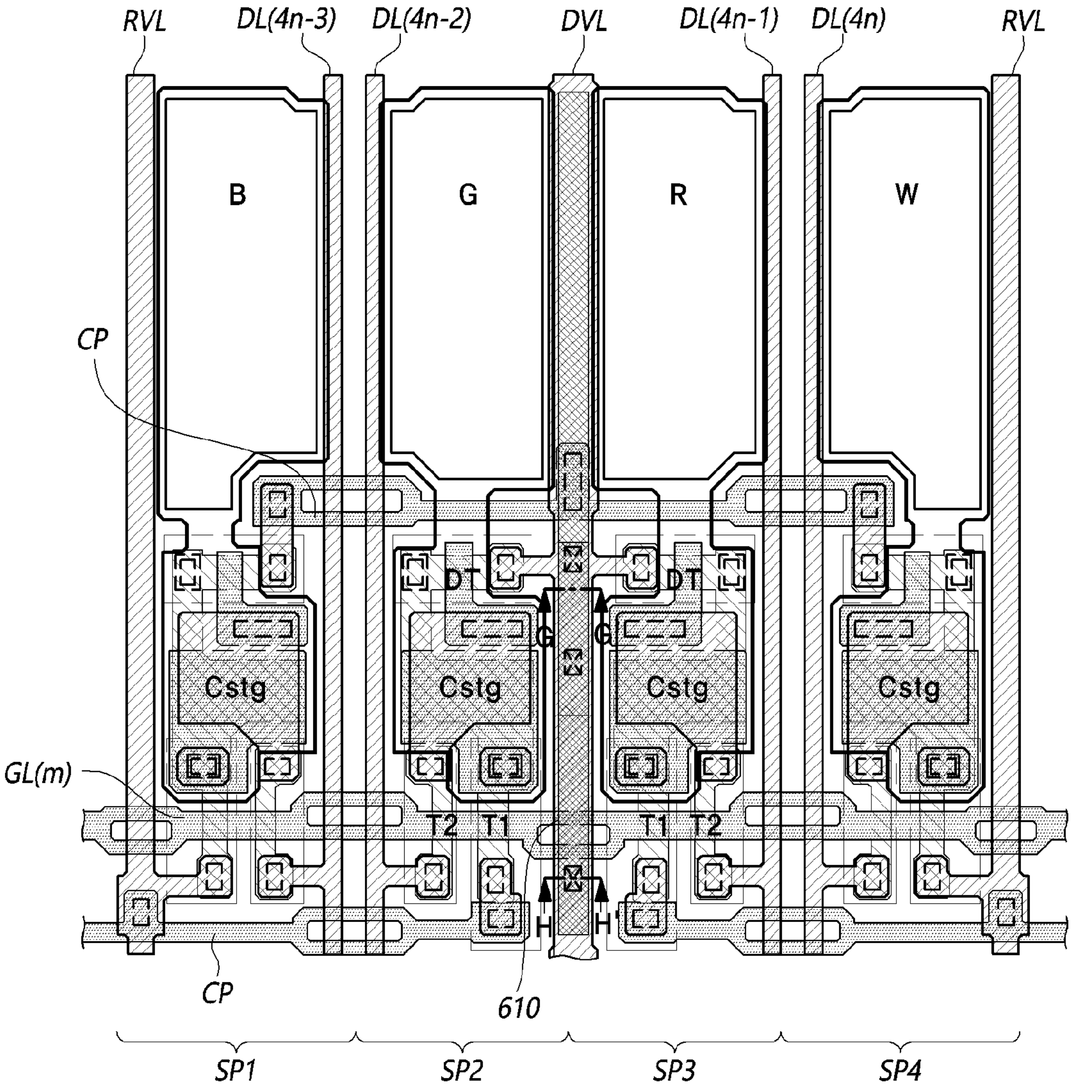
FIG. 9A is a plan view of a subpixel of the display device in the present disclosure.
Figure 9B:
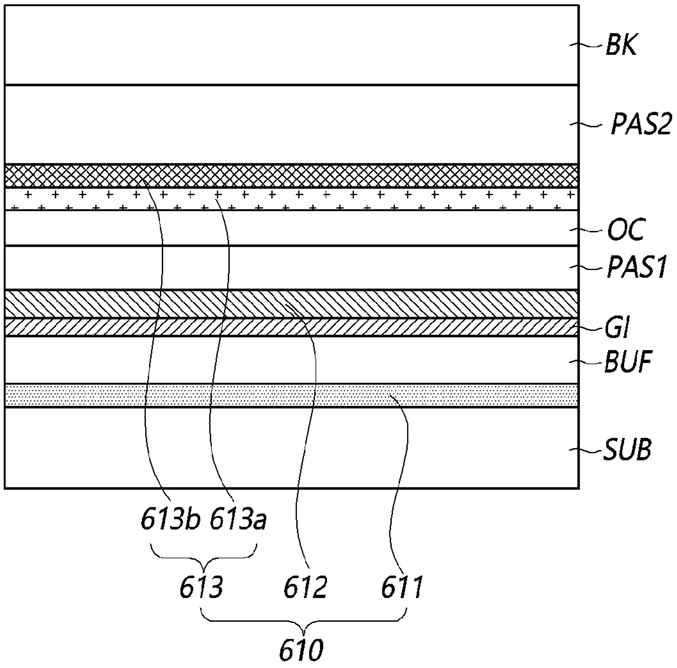
FIG. 9B is a cross-sectional view taken along G-G' of FIG. 9A.
Figure 9C:
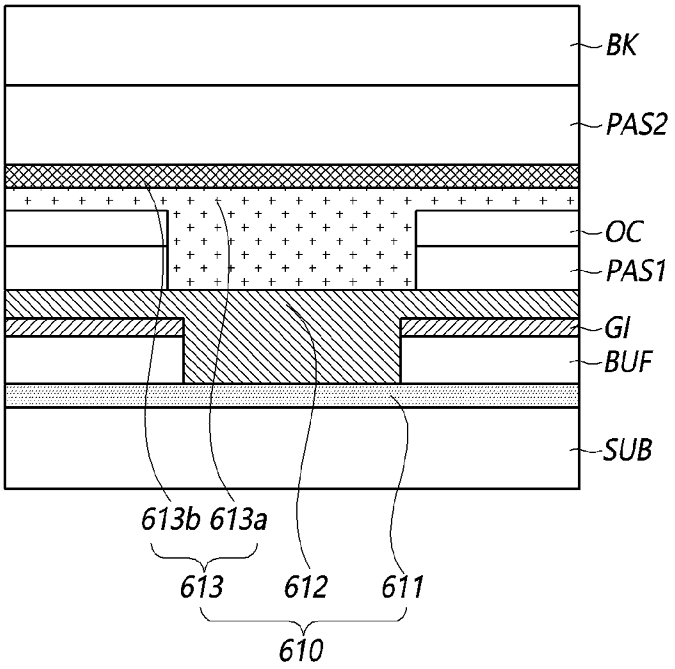
FIG. 9C is a cross-sectional view taken along H-H' of FIG. 9A.

FIG. 9A is a plan view of a subpixel of the display device in accordance with the aspects of the present disclosure, FIG. 9B is a cross-sectional view taken along line G-G' of FIG. 9A, and FIG. 9C is a cross-sectional view taken along line H-H' of FIG. 9A. In the following description, the same or similar content to that described above with reference to FIGS. 1 to 8C will be omitted or simply described.

For example, FIG. 9A is a plan view illustrating a fourth link portion 610 which is disposed between circuit portions of a plurality of subpixels, FIG. 9B is a cross-sectional view illustrating the structure of triple wirings of the fourth link portion 610, and FIG. 9C is a cross-sectional view illustrating a structure in which the triple wirings of the fourth link portion 610 are electrically connected.

Referring to FIG. 9A, the fourth link portion 610 may be connected to a light emitting element. The light emitting element may include a driving transistor DT which drives the light emitting element, and the fourth link portion 610 may be connected to the driving transistor DT.

Since the configuration of the fourth link portion 610 disclosed in FIGS. 9B and 9C is substantially the same as the configuration of the first link portion 210 disclosed in FIG. 6B, the same or similar content will be omitted or simply described.

Referring to FIGS. 9B and 9C, the fourth link portion 610 may include a fourth metal layer 611, a fourth signal wiring 612 and a fourth link wiring 613. The fourth link wiring 613 may include a first layer 613*a* and a second layer 613*b* which is disposed on the first layer 613*a*.

Referring to FIGS. 9B and 9C, the fourth link portion 610 may include the substrate SUB, the fourth metal layer 611, the buffer layer BUF, the gate insulating film GI, the fourth signal wiring 612, the passivation layer PAS1, the planarization layer OC, the fourth link wiring 613, and the low-temperature passivation layer PAS2.

The fourth metal layer 611 may be the same material layer as a light shield. The light shield as a layer for protecting a transistor included in the display device may be a layer which is positioned between the transistor and the substrate SUB.

The fourth signal wiring 612 may be disposed in an area which overlaps with the fourth metal layer 611.

The fourth signal wiring 612 may be a driving voltage wiring DVL to which the driving voltage EVDD is applied.

The fourth signal wiring 612 may be connected to the driving transistor DT.

The fourth link wiring 613 may include the first layer 613*a* and the second layer 613*b* which is disposed on the first layer 613*a*.

The first layer 613*a* may include a transparent conductive oxide layer.

The transparent conductive oxide layer may include one transparent conductive oxide (TCO) of indium tin oxide (ITO), indium zinc oxide (IZO), indium tin zinc oxide (ITZO), indium gallium zinc oxide (IGZO), and zinc oxide and tin oxide.

The second layer 613*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

Referring to FIG. 9C, the triple wirings which constitute the fourth link portion 610 may be electrically connected through contact holes.

The fourth link wiring 613 and the fourth signal wiring 612 may be electrically connected through a contact hole. For example, the first layer 613*a* of the fourth link wiring 613 may be electrically connected to the fourth signal wiring 612 through a contact hole which is formed in the planarization layer OC and the passivation layer PAS1.

The fourth signal wiring 612 and the fourth metal layer 611 may be electrically connected through a contact hole. For example, the fourth signal wiring 612 may be electrically connected to the fourth metal layer 611 through a contact hole which is formed in the buffer layer BUF and the gate insulating film GI.

In the display device in accordance with the aspects of the present disclosure, since the fourth link portion 610 includes a triple wiring structure including a low-resistance metal at an area where the fourth link portion 610 which is connected to a light emitting element is positioned, it is possible to reduce heat generation of the light emitting element by lowering current density.

Figure 10A:
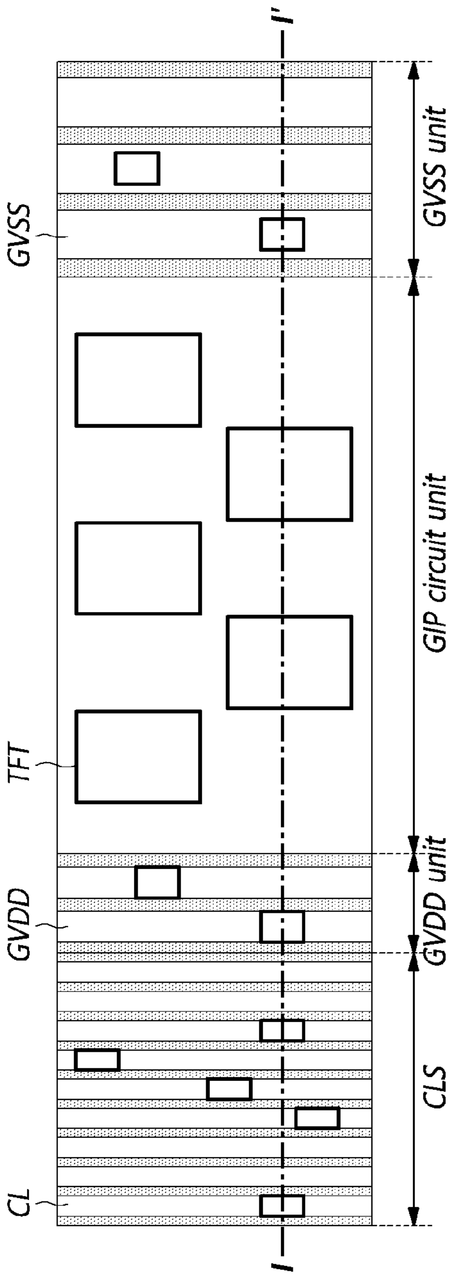
FIG. 10A is an enlarged view of area G of FIG. 4 to which a structure in accordance with an aspect of the present disclosure is not applied.
Figure 10B:
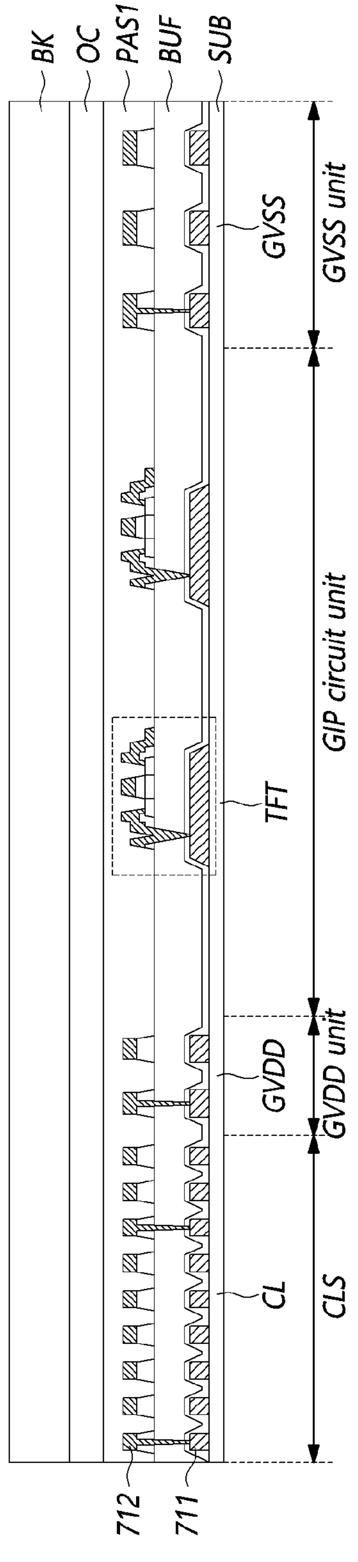
FIG. 10B is a cross-sectional view taken along line I-I' of FIG. 10A.
Figure 11A:
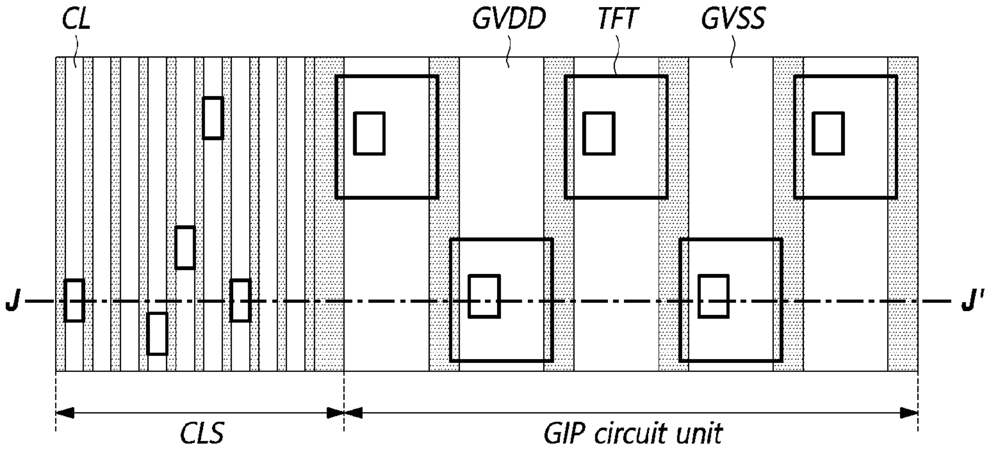
FIG. 11A is an enlarged view of area G of FIG. 4 to which a structure in accordance with an aspect of the present disclosure is applied.
Figure 11B:
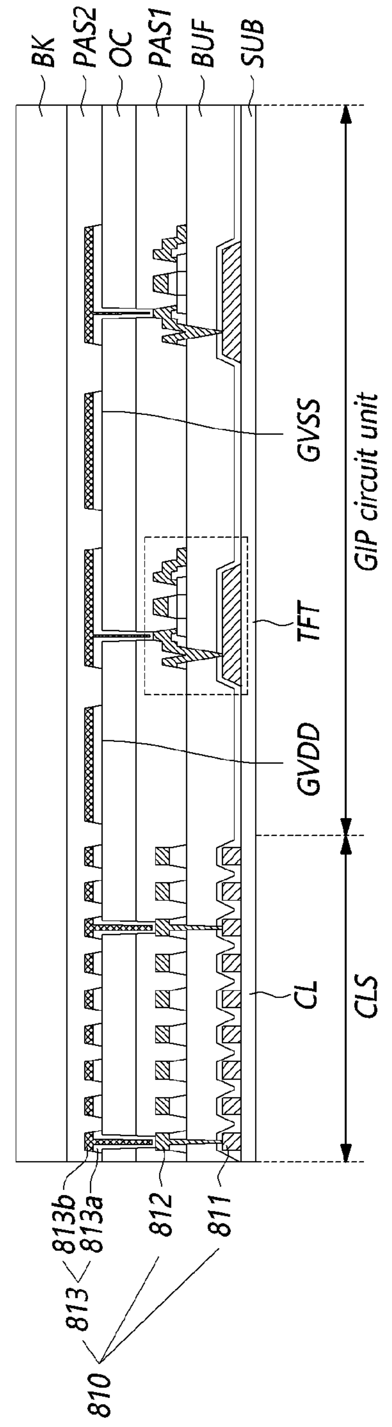
FIG. 11B is a cross-sectional view taken along line J-J' of FIG. 11A.

FIG. 10A is an enlarged view of an area G of FIG. 4 to which a structure in accordance with an aspect of the present disclosure is not applied, and FIG. 10B is a cross-sectional view taken along the line I-I' of FIG. 10A. FIG. 11A is an enlarged view of the area G of FIG. 4 to which a structure in accordance with an aspect of the present disclosure is applied, and FIG. 11B is a cross-sectional view taken along the line J-J' of FIG. 11A. In the following description, the same or similar content to that described above with reference to FIGS. 1 to 9C will be omitted or simply described.

Referring to FIGS. 10A and 10B, in a bezel area of a conventional display device to which an aspect of the present disclosure is not applied, a clock wiring unit CLS in which clock wirings CL are disposed, a gate driving voltage (GVDD) unit in which gate driving voltage lines are disposed, a GIP circuit unit in which gate driving thin film transistors TFT are disposed and a gate base voltage (GVSS) unit in which gate base voltage lines are disposed are disposed inwardly from the outside of the bezel area.

In the conventional display device, since the separate gate driving voltage (GVDD) unit and gate base voltage (GVSS) unit are disposed on both sides of the GIP circuit unit, there is a limitation in reducing the bezel area. In addition, since the clock wiring of the clock wiring unit CLS has a double wiring structure of a metal layer 711 and a signal wiring 712, the wiring should have at least a predetermined width to reduce current density. Therefore, in the conventional display device, a problem may arise in that it is difficult to reduce the width of the bezel area to the predetermined width or less.

Referring to FIGS. 11A and 11B, in a bezel area of the display device to which an aspect of the present disclosure is applied, a clock wiring unit CLS in which clock wirings CL are disposed and a GIP circuit unit in which gate driving voltage lines, gate driving thin film transistors TFT and gate base voltage lines are disposed may be disposed inwardly from the outside of the bezel area.

Referring to FIGS. 11A and 11B, the non-active area may include a fifth link portion 810 and the clock wiring unit CLS. The fifth link portion 810 may be connected to the clock wiring CL of the clock wiring unit CLS.

Since the configuration of the fifth link portion 810 disclosed in FIGS. 11A and 11B is substantially the same as the configuration of the first link portion 210 disclosed in FIG. 6B, the same or similar content will be omitted or simply described.

Referring to FIGS. 11A and 11B, the fifth link portion 810 may include a fifth metal layer 811, a fifth signal wiring 812 and a fifth link wiring 813. The fifth link wiring 813 may include a first layer 813*a* and a second layer 813*b* which is disposed on the first layer 813*a*.

Referring to FIGS. 11A and 11B, the fifth link portion 810 may include the substrate SUB, the fifth metal layer 811, the buffer layer BUF, the gate insulating film GI, the fifth signal wiring 812, the passivation layer PAS1, the planarization layer OC, the fifth link wiring 813, and the low-temperature passivation layer PAS2.

The fifth metal layer 811 may be the same material layer as a light shield. The light shield as a layer for protecting a transistor included in the display device may be a layer which is positioned between the transistor and the substrate SUB.

The fifth signal wiring 812 may be disposed in an area which overlaps with the fifth metal layer 811.

The fifth signal wiring 812 may be the clock wiring CL through which a clock signal is transferred.

The fifth link wiring 813 may include the first layer 813*a* and the second layer 813*b* which is disposed on the first layer 813*a*.

The first layer 813*a* may include a transparent conductive oxide layer.

The transparent conductive oxide layer may include one transparent conductive oxide (TCO) of one of indium tin oxide (ITO), indium zinc oxide (IZO), indium tin zinc oxide (ITZO), indium gallium zinc oxide (IGZO), and zinc oxide and tin oxide.

The second layer 813*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

Referring to FIG. 11B, triple wirings which constitute the fifth link portion 810 may be electrically connected through contact holes.

The fifth link wiring 813 and the fifth signal wiring 812 may be electrically connected through a contact hole. For example, the first layer 813*a* of the fifth link wiring 813 may be electrically connected to the fifth signal wiring 812 through a contact hole which is formed in the planarization layer OC and the passivation layer PAS1.

The fifth signal wiring 812 and the fifth metal layer 811 may be electrically connected through a contact hole. For example, the fifth signal wiring 812 may be electrically connected to the fifth metal layer 811 through a contact hole which is formed in the buffer layer BUF and the gate insulating film GI.

In the display device in accordance with the aspects of the present disclosure, since the clock wiring CL disposed in the clock wiring unit CLS includes a triple wiring structure including a low-resistance metal, the width of the clock wiring CL may be reduced by lowering the current density of the clock wring CL. Therefore, since the width of the clock wiring unit CLS may be reduced, the width of the bezel area including the clock wiring unit CLS may be reduced.

Referring to FIGS. 11A and 11B, in the display device in accordance with the aspects of the present disclosure, by disposing the gate driving voltage (GVDD) unit and the gate base voltage (GVSS) unit by incorporating them with the GIP circuit unit, the width of the bezel area may be reduced.

Referring to FIGS. 11A and 11B, the non-active area may include a gate driving circuit unit (the GIP circuit unit) including the thin film transistors TFT. The gate driving circuit unit (the GIP circuit unit) may include a gate power wiring which is connected to a thin film transistor TFT. The gate power wiring may be disposed over the thin film transistor TFT.

The gate power wiring may be a gate driving voltage wiring GVDD or a gate base voltage wiring GVSS.

Referring to FIGS. 11A and 11B, the gate driving circuit unit (the GIP circuit unit) may include the thin film transistor TFT which is disposed on the substrate SUB, the planarization layer OC which is disposed over the thin film transistor TFT, the gate power wirings GVDD and GVSS which are disposed over the planarization layer OC, and the low-temperature passivation layer PAS2 which is disposed on the gate power wirings GVDD and GVSS.

The gate power wirings GVDD and GVSS and a source electrode or a drain electrode of the thin film transistor TFT may be electrically connected.

Referring to FIGS. 11A and 11B, the gate power wirings GVDD and GVSS may be triple wirings including the fifth metal layer 811, the fifth signal wiring 812 and the fifth link wiring 813.

The gate power wirings GVDD and GVSS may include the first layer 813*a* and the second layer 813*b* which is disposed on the first layer 813*a*.

The first layer 813*a* may include a transparent conductive oxide layer.

The transparent conductive oxide layer may include one transparent conductive oxide (TCO) of one of indium tin oxide (ITO), indium zinc oxide (IZO), indium tin zinc oxide (ITZO), indium gallium zinc oxide (IGZO), and zinc oxide and tin oxide.

The second layer 813*b* may include a low-resistance auxiliary metal layer.

The auxiliary metal layer may include at least one selected from the group consisting of silver (Ag), copper (Cu), gold (Au), aluminum (Al), tungsten (W), zinc (Zn), nickel (Ni), iron (Fe), platinum (Pt), lead (Pb) and alloys thereof.

Referring to FIG. 11B, the gate power wirings GVDD and GVSS may be electrically connected to the source electrode or the drain electrode of the thin film transistor TFT through a contact hole. For example, the first layer 813*a* of the gate power wirings GVDD and GVSS may be electrically connected to the source electrode or the drain electrode of the thin film transistor TFT through a contact hole which is formed in the planarization layer OC and the passivation layer PAS1.

In the display device in accordance with the aspects of the present disclosure, by disposing a gate power wiring including a transparent conductive oxide layer and a low-resistance auxiliary metal layer over the thin film transistor TFT disposed in the GIP circuit unit, a separate gate driving voltage unit and gate base voltage unit may not be disposed. Accordingly, by disposing a gate driving voltage (GVDD) unit and a gate base voltage (GVSS) unit by incorporating them with the GIP circuit unit, the width of the bezel area may be reduced.

FIGS. 12A to 12G are schematic process diagrams of manufacturing the display device in accordance with the aspects of the present disclosure. In the following description, the same or similar content to that described above with reference to FIGS. 1 to 11B will be omitted or simply described.

Figure 12A:
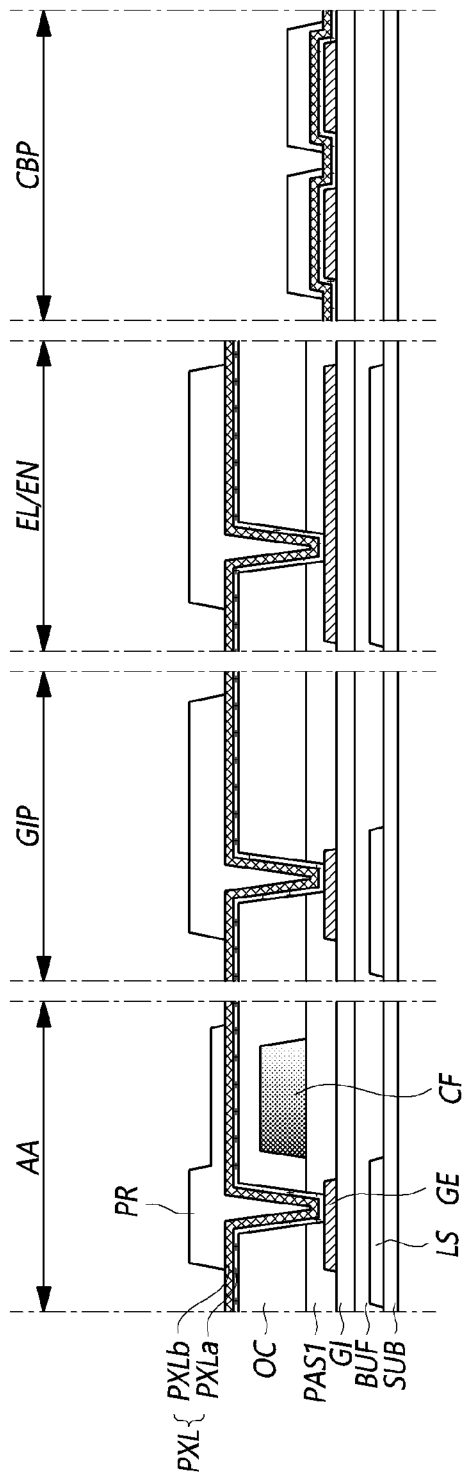
FIGS. 12A to 12G are schematic process diagrams of manufacturing the display device in the present disclosure.

Referring to FIG. 12A, a light shield LS, a buffer layer BUF, a gate insulating film GI, a gate GE and a passivation layer PAS1 are sequentially deposited on a substrate SUB.

After forming a color filter CF in an active area AA, a planarization layer OC is formed. Contact holes are formed in the active area AA, a GIP area GIP and a wiring link portion area EL/EN by etching the planarization layer OC and the passivation layer PAS1, and the planarization layer OC of a pad area CBP is removed.

A transparent conductive oxide layer PXLa and a low-resistance metal layer PXLb are sequentially deposited on an entire surface, and a photoresist PR is deposited using half-tone and full-tone masks.

Figure 12B:
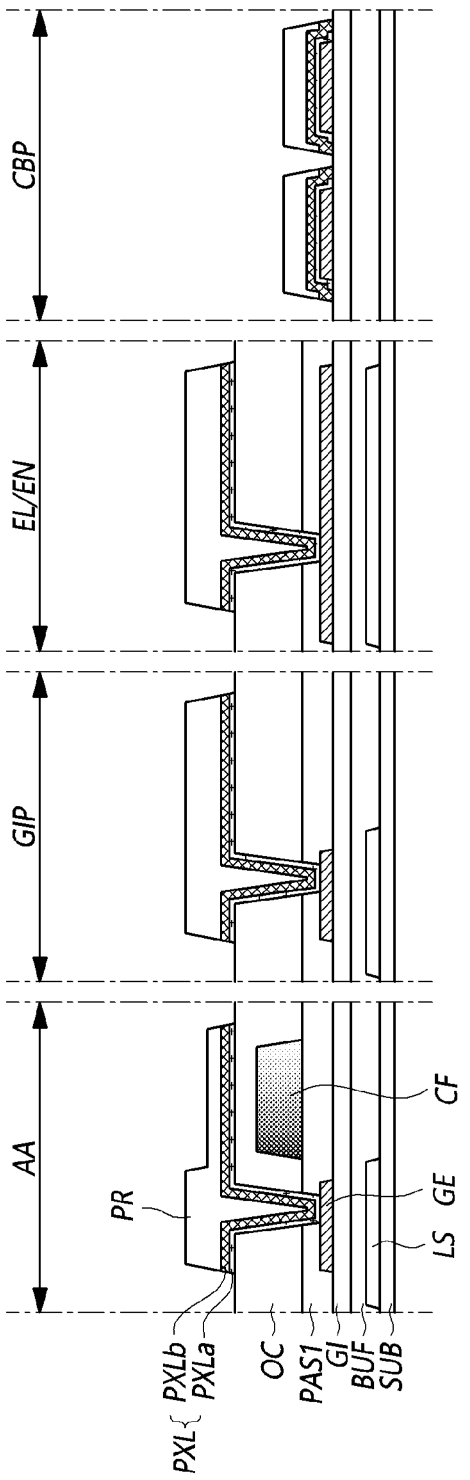

Referring to FIG. 12B, the transparent conductive oxide layer PXLa and the low-resistance metal layer PXLb are simultaneously etched using an etchant capable of simultaneously etching the transparent conductive oxide layer PXLa and the low-resistance metal layer PXLb.

Figure 12C:
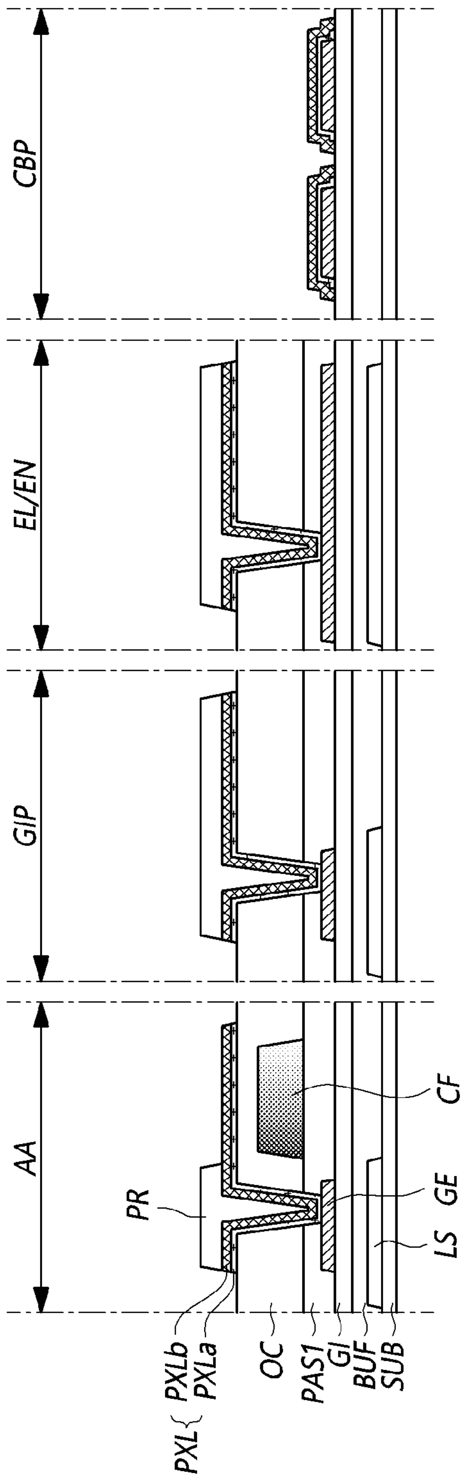

Referring to FIG. 12C, the photoresist PR of areas to which the half-tone masks are applied is removed by ashing.

Figure 12D:
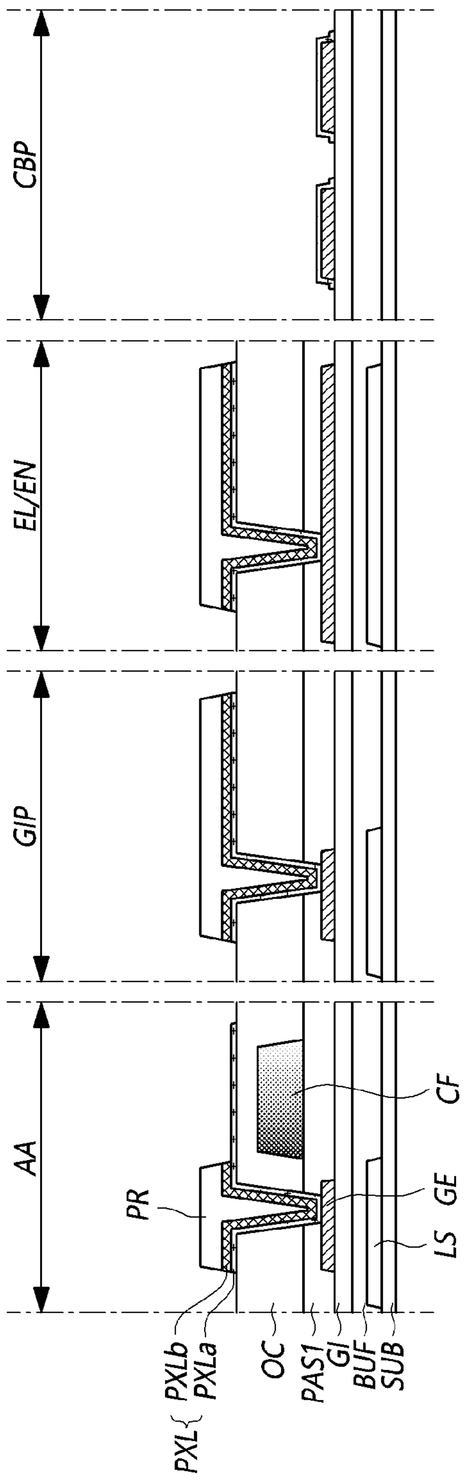

Referring to FIG. 12D, the low-resistance metal layer PXLb of the active area AA and the pad area CBP is etched using an etchant capable of etching only the low-resistance metal layer PXLb.

Figure 12E:
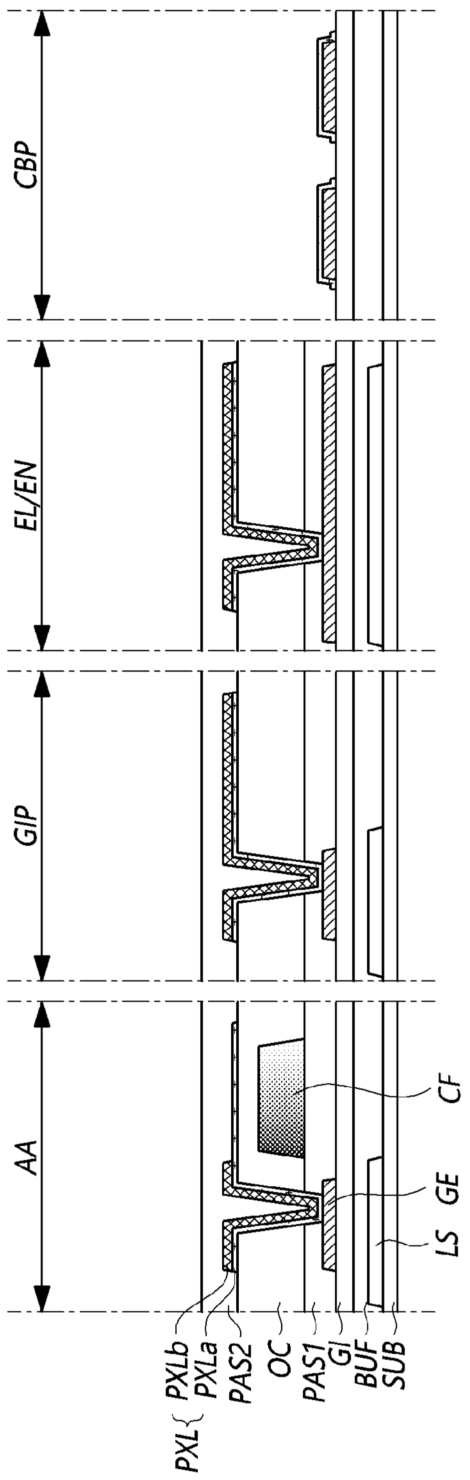

Referring to FIG. 12E, the photoresist PR of areas to which the full-tone masks are applied is removed.

Figure 12F:
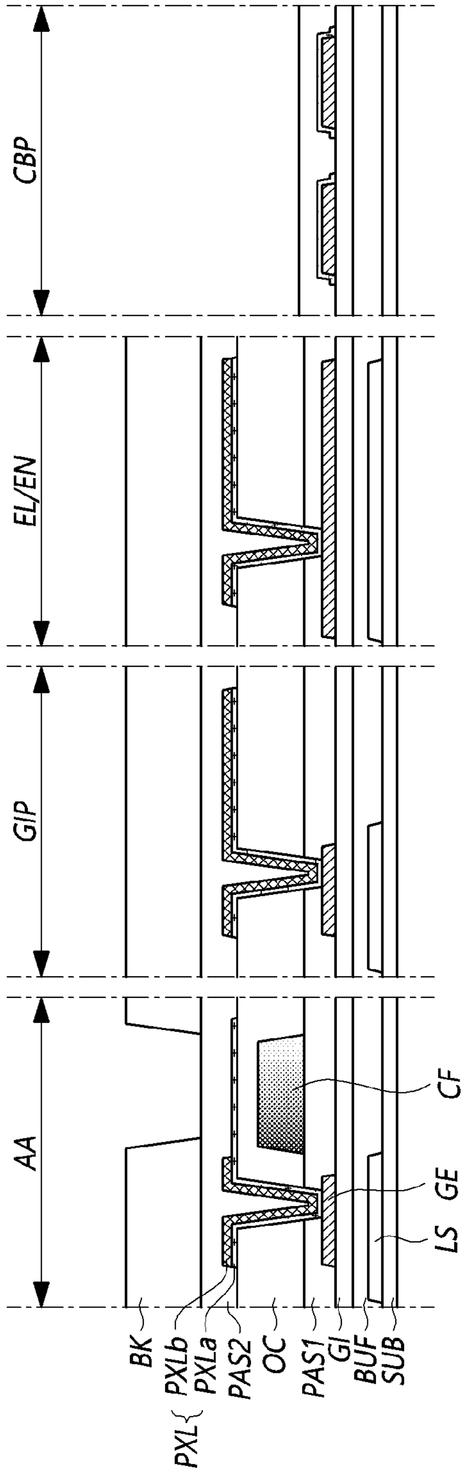

Referring to FIG. 12F, after depositing a low-temperature passivation layer PAS2 on the entire surface through a low-temperature process, a bank BK is formed using a mask.

Figure 12G:
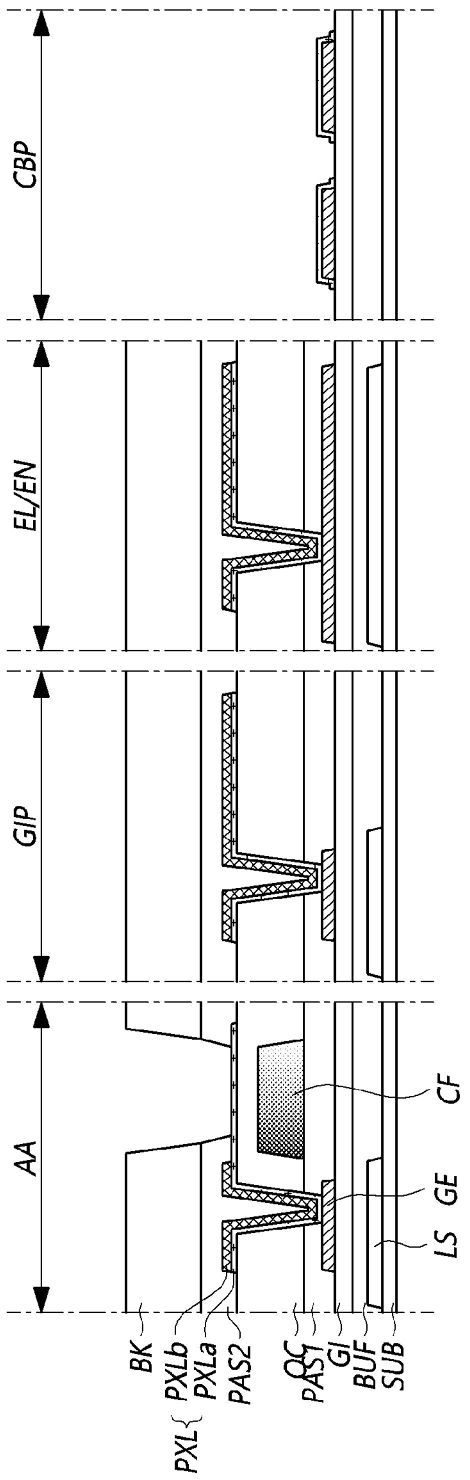

Referring to FIG. 12G, the low-temperature passivation layer PAS2 of an open area of the active area AA and the pad area CBP is removed by dry etching.

By using the exemplary processes of FIGS. 12A to 12G, a display device including link portions of a triple wiring structure which includes a metal layer, a signal wiring and a link wiring including a low-resistance metal may be manufactured.

A brief description of the aspects of the present disclosure described above is as follows.

A display device in accordance with aspects of the present disclosure may include a substrate including an active area and a non-active area which surrounds the active area, a plurality of circuit films positioned at a first side of the substrate and positioned in the non-active area to be spaced apart from each other, and a first link portion connected to a connection wiring of the circuit film in the non-active area, the first link portion including a first metal layer disposed on the substrate, a buffer layer covering an upper surface of the substrate and the first metal layer, a gate insulating film disposed on the buffer layer, a first signal wiring disposed on the gate insulating film, a planarization layer covering an upper surface of the buffer layer and the first signal wiring, a first link wiring disposed on the planarization layer, and a low-temperature passivation layer covering an upper surface of the planarization layer and the first link wiring, wherein the first link wiring and the first signal wiring and the first signal wiring and the first metal layer are electrically connected through contact holes, respectively.

In the display device in accordance with the aspects of the present disclosure, the first link wiring may include a transparent conductive oxide layer and an auxiliary metal layer which is disposed on the transparent conductive oxide layer.

In the display device in accordance with the aspects of the present disclosure, the transparent conductive oxide layer may include one of indium tin oxide (ITO), indium zinc oxide (IZO), indium tin zinc oxide (ITZO), indium gallium zinc oxide (IGZO), zinc oxide and tin oxide.

In the display device in accordance with the aspects of the present disclosure, the auxiliary metal layer may include one of silver (Ag), copper (Cu), gold (Au), aluminum (Al), tungsten (W), zinc (Zn), nickel (Ni), iron (Fe), platinum (Pt), lead (Pb) and alloys thereof.

In the display device in accordance with the aspects of the present disclosure, the first signal wiring may be a driving voltage wiring.

The display device in accordance with the aspects of the present disclosure may further include a first bar parallel to the first side and disposed in the non-active area, and a second link portion connected to the first bar, the second link portion including a second metal layer disposed on the substrate, the buffer layer covering the upper surface of the substrate and the second metal layer, the gate insulating film disposed on the buffer layer, a second signal wiring disposed on the gate insulating film, the planarization layer covering the upper surface of the buffer layer and the second signal wiring, a second link wiring disposed on the planarization layer, and a low-temperature passivation layer covering the upper surface of the planarization layer and the second link wiring, wherein the second link wiring and the second signal wiring and the second signal wiring and the second metal layer are electrically connected through contact holes, respectively.

In the display device in accordance with the aspects of the present disclosure, the second link wiring may include a transparent conductive oxide layer and an auxiliary metal layer which is disposed on the transparent conductive oxide layer.

The display device in accordance with the aspects of the present disclosure may further include an electrode pattern positioned between first link portions of first signal wirings, and a third link portion connected to the electrode pattern, the third link portion including a third metal layer disposed on the substrate, the buffer layer disposed on the third metal layer, the gate insulating film disposed on the buffer layer, a third signal wiring disposed on the gate insulating film, the planarization layer disposed on the third signal wiring, a third ling wiring disposed on the planarization layer, and a low-temperature passivation layer disposed on the third link wiring, wherein the third link wiring and the third signal wiring and the third signal wiring and the third metal layer are electrically connected through contact holes, respectively.

In the display device in accordance with the aspects of the present disclosure, the electrode pattern and the third signal wiring may be integrally formed.

In the display device in accordance with the aspects of the present disclosure, the third link wiring may include a transparent conductive oxide layer and an auxiliary metal layer which is disposed on the transparent conductive oxide layer.

In the display device in accordance with the aspects of the present disclosure, the electrode pattern may apply a common voltage.

The display device in accordance with the aspects of the present disclosure may further include a subpixel disposed in the active area and including a light emitting element, and a fourth link portion connected to the light emitting element, the fourth link portion including a fourth metal layer disposed on the substrate, the buffer layer disposed on the fourth metal layer, the gate insulating film disposed on the buffer layer, a fourth signal wiring disposed on the gate insulating film, the planarization layer disposed on the fourth signal wiring, a fourth link wiring disposed on the planarization layer, and a low-temperature passivation layer disposed on the fourth link wiring, wherein the fourth link wiring and the fourth signal wiring and the fourth signal wiring and the fourth metal layer are electrically connected through contact holes, respectively.

In the display device in accordance with the aspects of the present disclosure, the fourth link wiring may include a transparent conductive oxide layer and an auxiliary metal layer which is disposed on the transparent conductive oxide layer.

In the display device in accordance with the aspects of the present disclosure, the fourth signal wiring may be a driving voltage wiring.

The display device in accordance with the aspects of the present disclosure may further include a clock wiring unit disposed in the non-active area and including a clock wiring, and a fifth link portion connected to the clock wiring, the fifth link portion including a fifth metal layer disposed on the substrate, the buffer layer disposed on the fifth metal layer, the gate insulating film disposed on the buffer layer, a fifth signal wiring disposed on the gate insulating film, the planarization layer disposed on the fifth signal wiring, a fifth link wiring disposed on the planarization layer, and a low-temperature passivation layer disposed on the fifth link wiring, wherein the fifth link wiring and the fifth signal wiring and the fifth signal wiring and the fifth metal layer are electrically connected through contact holes, respectively.

In the display device in accordance with the aspects of the present disclosure, the fifth link wiring may include a transparent conductive oxide layer and an auxiliary metal layer which is disposed on the transparent conductive oxide layer.

The display device in accordance with the aspects of the present disclosure may further include a gate driving circuit unit disposed in the non-active area and including a thin film transistor, and a gate power wiring connected to the thin film transistor, the gate driving circuit unit including the thin film transistor disposed on the substrate, the planarization layer disposed on the thin film transistor, a gate power wiring disposed on the planarization layer, and a low-temperature passivation layer disposed on the gate power wiring, wherein the gate power wiring and a source electrode or a drain electrode of the thin film transistor are electrically connected.

In the display device in accordance with the aspects of the present disclosure, the gate power wiring may include a transparent conductive oxide layer and an auxiliary metal layer which is disposed on the transparent conductive oxide layer.

In the display device in accordance with the aspects of the present disclosure, the gate power wiring may be a gate driving voltage wiring or a gate base voltage wiring.

According to the aspects of the present disclosure, it is possible to provide a display device capable of preventing a pol-melting phenomenon of a display panel, by reducing heat generation of the display panel by lowering current density, through including a triple wiring structure including a low-resistance metal in a link portion where a plurality of signal wirings are integrated.

According to the aspects of the present disclosure, it is possible to provide a display device which is capable of being driven with high luminance, by reducing heat generation of a display panel by lowering current density.

According to the aspects of the present disclosure, it is possible to provide a display device which is capable of low power consumption, by reducing heat generation of a panel by lowering current density.

According to the aspects of the present disclosure, it is possible to provide a display device which is capable of a narrow bezel, by reducing an area where wirings are disposed.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:

a substrate including an active area and a non-active area which surrounds the active area;

a plurality of circuit films positioned at a first side of the substrate and positioned in the non-active area, the plurality of circuit films spaced apart from one another; and a first link portion connected to a connection wiring of the plurality of circuit films positioned in the non-active area, wherein the first link portion comprises:

a first metal layer disposed on the substrate;

a buffer layer covering an upper surface of the substrate and the first metal layer;

a gate insulating film disposed on the buffer layer;

a first signal wiring disposed on the gate insulating film;

a planarization layer covering an upper surface of the buffer layer and the first signal wiring; and a first link wiring disposed on the planarization layer, wherein the first link wiring and the first signal wiring are electrically connected through contact holes and the first signal wiring and the first metal layer are electrically connected through the contact holes, wherein the first link wiring comprises a transparent conductive oxide layer and an auxiliary metal layer which is disposed on the transparent conductive oxide layer, and wherein the first link portion further comprises a low-temperature passivation layer covering an upper surface of the planarization layer and the first link wiring.

2. The display device of claim 1, wherein the transparent conductive oxide layer includes one of indium tin oxide (ITO), indium zinc oxide (IZO), indium tin zinc oxide (ITZO), indium gallium zinc oxide (IGZO), zinc oxide and tin oxide.

3. The display device of claim 1, wherein the auxiliary metal layer includes one of silver (Ag), copper (Cu), gold (Au), aluminum (Al), tungsten (W), zinc (Zn), nickel (Ni), iron (Fe), platinum (Pt), lead (Pb) and alloys thereof.

4. The display device of claim 1, wherein the first signal wiring is a driving voltage wiring.

5. The display device of claim 1, further comprising:

a first bar parallel to the first side, and disposed in the non-active area; and a second link portion connected to the first bar, wherein the second link portion comprises:

a second metal layer disposed on the substrate, wherein the buffer layer covers the upper surface of the substrate and the second metal layer; and the gate insulating film disposed on the buffer layer;

a second signal wiring disposed on the gate insulating film, wherein the planarization layer covers the upper surface of the buffer layer and the second signal wiring; and a second link wiring disposed on the planarization layer, wherein the second link wiring and the second signal wiring are electrically connected through contact holes and the second signal wiring and the second metal layer are electrically connected through the contact holes.

6. The display device of claim 5, wherein the second link wiring includes a transparent conductive oxide layer and an auxiliary metal layer which is disposed on the transparent conductive oxide layer, and wherein the second link portion further comprises a low-temperature passivation layer covering an upper surface of the planarization layer and the second link wiring.

7. The display device of claim 1, further comprising:

an electrode pattern positioned between first link portions of first signal wirings; and a third link portion connected to the electrode pattern, wherein the third link portion comprises:

a third metal layer disposed on the substrate, the buffer layer disposed on the third metal layer, and the gate insulating film is disposed on the buffer layer;

a third signal wiring disposed on the gate insulating film, the planarization layer disposed on the third signal wiring; and a third link wiring disposed on the planarization layer, wherein the third link wiring and the third signal wiring and the third signal wiring and the third metal layer are electrically connected through contact holes, respectively.

8. The display device of claim 7, wherein the electrode pattern and the third signal wiring are integrally formed.

9. The display device of claim 7, wherein the third link wiring includes a transparent conductive oxide layer and an auxiliary metal layer which is disposed on the transparent conductive oxide layer, and wherein the third link portion further comprises a low-temperature passivation layer disposed on the third link wiring.

10. The display device of claim 7, wherein the electrode pattern applies a common voltage.

11. The display device of claim 1, further comprising:

a subpixel disposed in the active area, and including a light emitting element; and a fourth link portion connected to the light emitting element, wherein the fourth link portion comprises:

a fourth metal layer disposed on the substrate, wherein the buffer layer is disposed on the fourth metal layer, and the gate insulating film is disposed on the buffer layer;

a fourth signal wiring disposed on the gate insulating film, wherein the planarization layer is disposed on the fourth signal wiring; and a fourth link wiring disposed on the planarization layer, wherein the fourth link wiring and the fourth signal wiring are electrically connected through contact holes and the fourth signal wiring and the fourth metal layer are electrically connected through the contact holes.

12. The display device of claim 11, wherein the fourth link wiring includes a transparent conductive oxide layer and an auxiliary metal layer which is disposed on the transparent conductive oxide layer, and wherein the fourth link portion further comprises a low-temperature passivation layer disposed on the fourth link wiring.

13. The display device of claim 11, wherein the fourth signal wiring is a driving voltage wiring.

14. The display device of claim 1, further comprising:

a clock wiring unit disposed in the non-active area, and including a clock wiring; and a fifth link portion connected to the clock wiring, wherein the fifth link portion comprises:

a fifth metal layer disposed on the substrate, wherein the buffer layer is disposed on the fifth metal layer, and the gate insulating film is disposed on the buffer layer;

a fifth signal wiring disposed on the gate insulating film, wherein the planarization layer is disposed on the fifth signal wiring; and a fifth link wiring disposed on the planarization layer, wherein the fifth link wiring and the fifth signal wiring are electrically connected through contact holes and the fifth signal wiring and the fifth metal layer are electrically connected through the contact holes.

15. The display device of claim 14, wherein the fifth link wiring includes a transparent conductive oxide layer and an auxiliary metal layer which is disposed on the transparent conductive oxide layer, and wherein the fifth link portion further comprises a low-temperature passivation layer covering an upper surface of the planarization layer and the fifth link wiring.

16. The display device of claim 1, further comprising:

a gate driving circuit unit disposed in the non-active area, and including a thin film transistor; and a gate power wiring connected to the thin film transistor disposed on the substrate, wherein the planarization layer is disposed on the thin film transistor, wherein the gate power wiring is disposed on the planarization layer, and wherein the gate power wiring and a source electrode or a drain electrode of the thin film transistor are electrically connected.

17. The display device of claim 16, wherein the gate power wiring includes a transparent conductive oxide layer and an auxiliary metal layer which is disposed on the transparent conductive oxide layer, and wherein the gate driving circuit unit further comprises a low-temperature passivation layer covering an upper surface of the planarization layer and the gate power wiring.

18. The display device of claim 16, wherein the gate power wiring is a gate driving voltage wiring or a gate base voltage wiring.

* * * * *